United States Patent
Solé et al.

(10) Patent No.: US 11,494,529 B1
(45) Date of Patent: Nov. 8, 2022

(54) SYSTEM FOR DESIGN VISUALIZATION USING ACTUAL PRODUCT IMAGES

(71) Applicant: Architectural Surfaces Group, LLC, Austin, TX (US)

(72) Inventors: Pol Cámara Solé, Canary Islands (ES); Francisco Acosta, Dallas, TX (US)

(73) Assignee: ARCHITECTURAL SURFACES GROUP, LLC, Austin, TX (US)

( * ) Notice: Subject to any disclaimer, the term of this patent is extended or adjusted under 35 U.S.C. 154(b) by 0 days.

(21) Appl. No.: 17/001,268

(22) Filed: Aug. 24, 2020

Related U.S. Application Data

(63) Continuation of application No. 16/014,604, filed on Jun. 21, 2018, now Pat. No. 10,762,249.

(60) Provisional application No. 62/523,083, filed on Jun. 21, 2017.

(51) Int. Cl.
  *G06T 19/20* (2011.01)
  *G06F 30/13* (2020.01)
  *G06Q 30/06* (2012.01)

(52) U.S. Cl.
  CPC ......... *G06F 30/13* (2020.01); *G06Q 30/0621* (2013.01); *G06Q 30/0627* (2013.01); *G06T 19/20* (2013.01)

(58) Field of Classification Search
  None
  See application file for complete search history.

(56) References Cited

U.S. PATENT DOCUMENTS

| | | | | |
|---|---|---|---|---|
| 2009/0138113 A1* | 5/2009 | Hoguet | ........... | G06F 30/13 700/98 |
| 2010/0268513 A1* | 10/2010 | Loberg | ........... | G06F 30/13 703/1 |
| 2015/0244833 A1* | 8/2015 | Grue | ........... | H04M 1/72561 709/219 |
| 2018/0285481 A1* | 10/2018 | Czmyrid | ........... | G06F 30/13 |

OTHER PUBLICATIONS

Moving Objects Without Restrictions. (Jul. 16, 2015). Retrieved from https://www.homedesignersoftware.com/support/article/KB-00739/moving-objects-without-restrictions.html (Year: 2015).*

"Moving Objects Without Restrictions", retrieved from https://www.homedesignersoftware.com/support/article/KB-00739/moving-objects-without-restrictions.html, Jul. 16, 2015.

* cited by examiner

*Primary Examiner* — Vu Nguyen
(74) *Attorney, Agent, or Firm* — Alston & Bird LLP

(57) ABSTRACT

The present invention relates generally to a system for acquiring images of real stone slabs, visualize them virtually them in a 1:1. ratio, and design and view the final installation in 2D and 3D with the actual slabs instead of sample photography. This feat is achieved by the combination of multiple systems. Which include: 1.—A process to take the photographies 2.—A computer system to store and manage a virtual warehouse of actual slab images, 3.—a 1:1 display system, 4.—a catalog application and 5.—a visualization tool.

18 Claims, 55 Drawing Sheets

What are you looking for

[ Search for material ]

Color
Green    Yellow    Blue
Orange   Grey      White
Cream    Yellow    Pink

Type
Marble   Granite        Quartz
Quartzite Soft Quartzite

First Letter

A B C D E F G H I J K L
M N O P Q R S T U V W
X Y Z

[ NEXT ]

FIG. 4

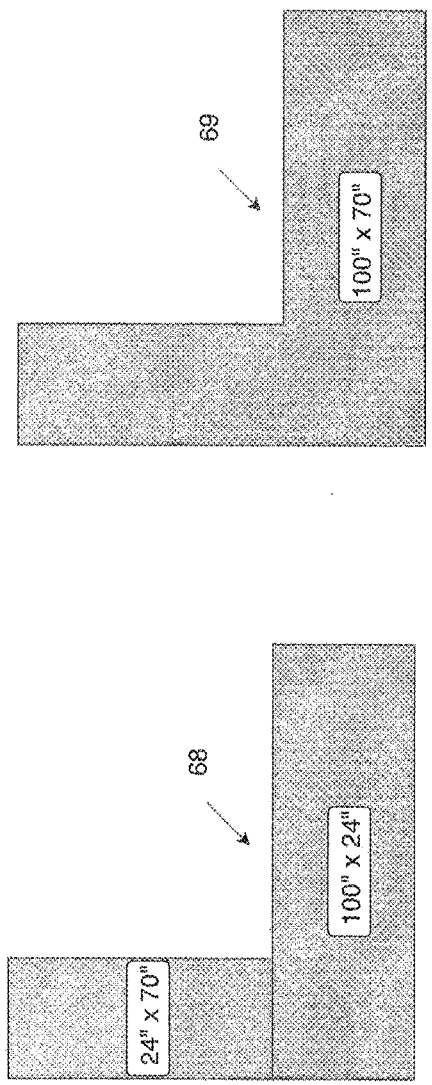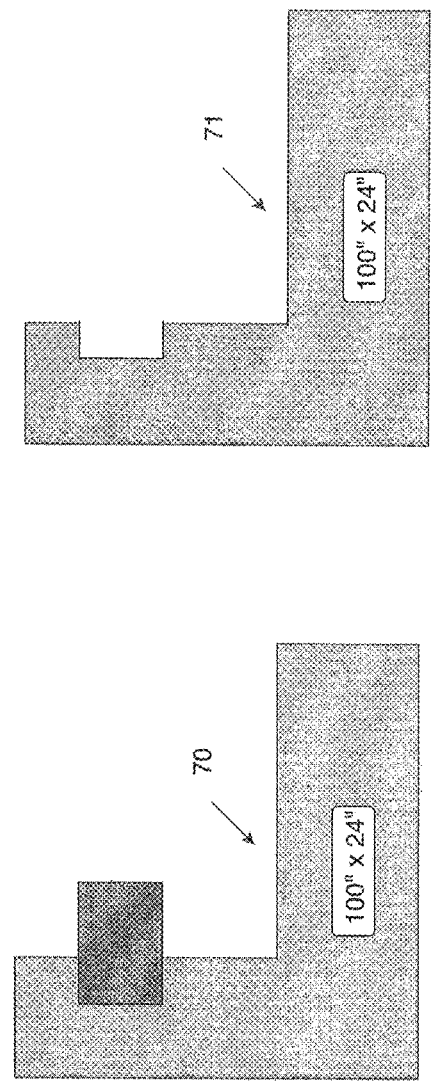
FIG. 17
FIG. 18

What are you looking for?

Search for material

| Color | Type | First Letter |
|---|---|---|
| Green. Yellow. Blue | Granite. Marble. Quartz | A. B. C. D. E. F. G. H. I. J. K. L. M. N. |
| Orange. Grey. White | Quartzite. Soft Quartzite | O. P. Q. R. S. T. U. V. W. X. Y. Z |
| Cream. Purple. Pink | | |

NEXT

FIG 33

SYSTEM FOR DESIGN VISUALIZATION USING ACTUAL PRODUCT IMAGES

CROSS REFERENCE TO RELATED APPLICATION

This application is a continuation application of U.S. application Ser. No. 16/014,604 filed Jun. 21, 2018, which claims the benefit of U.S. Provisional Patent App. No. 62/523,083 filed Jun. 21, 2017, which is incorporated herein in their entirety.

BACKGROUND

1. Field of the Invention

The scope of the invention, covers a process called Stone Boutique technology system (SBTS). This system is made up of 3 different parts. The first part is called the Slab Image Acquisition System (SIAS), the Slab TV system, or STVS and finally the "MEC Software" (Manastone, Eyeslab, Counterpad). SBTS is a technology process that utilizes both hardware and software to monetize the selection and sale of natural stone. This process does the following tasks. Acquires photographs of the slabs. Stores them in a virtual warehouse (Manastone software) connected to the company ERP system. Displays them across a slab-sized monitor or monitors (STVS) using a catalog application (Eyeslab software). This is done so the user can see a 1:1 ratio of the real product, and do certain tasks like material comparisons etc. Build a visualization of stone applications like a countertops, a walls etc. using the previously selected slabs and display them in 3D using the SIAS system. Get that visualization (commonly known as 'the rendering") to multiple formats like a summary document, 3d model or CAD Drawing.

The present invention relates generally to a system for design visualization using actual product Images and more specifically a system with a distributed computer system to manage a virtual warehouse of actual slab Images and a visualization tool that allows the easy and realistic depictions of stone applications such as countertops using the actual slab images rather than stock photos.

2. Description of Related Art

Stone slabs, especially granite and marble slabs, are a popular choice for countertops, backsplashes and other applications in restaurants and homes. However, certain varieties of granite and marble are highly variegated both across the individual slab and across different slabs of the same type. Variegated granite and marble provides a one-of-a kind appearance because there is not a consistent vein pattern and there can be slight variations in color. The typical method for a customer choosing which granite or marble type to use is to look at small samples (typically less than 1 foot by 1 foot) and attempt to visualize what that would look like in larger slab sections at their house or business. Once a customer chooses which type or types the are interested in, the customer then usually makes a trip to the stone yard to look at and select the actual slab or slabs.

Another consideration is that in a room like a kitchen, there are typically sections of the countertop that must be pieced together because of geometry or size limitations. Often, there are sections of granite or marble that must be cut from two separate slabs that are pieced side-by-side, which can cause a noticeable variation in the pattern. Choosing which sections of the slab or slabs to use to make the individual pieces of a countertop is an important design consideration. However, it is currently very difficult to visualize what the finished countertop will look like specifically until the actual slab or slabs are cut and finished and put in place.

It is therefore desirable to have a System for design visualization using the actual slab images that can be manipulated to make realistic depiction of the actual finished applications.

DESCRIPTION OF THE DRAWINGS

The novel features believed characteristic of the embodiments of the present application are set forth in the appended claims. However, the embodiments themselves, as well as a preferred mode of use, and further objectives and advantages thereof, will best be understood by reference to the following detailed description when read in conjunction with the accompanying drawings, wherein:

FIG. 4 is an example of the Eyeslab graphical user Interface tor the Initial filtering of materials to be used in a project using the present Invention.

FIG. 13 is an example of the Counterpad graphical user Interface for drawing the stone surfaces, that will be applied with the stone later on.

FIG. 17 is an example on what does the boolean remove tool do.

FIG. 18 is an example on what does the boolean remove tool do.

FIG. 30-38 are examples of a graphical user Interface associated with the system and method.

Figure 1:
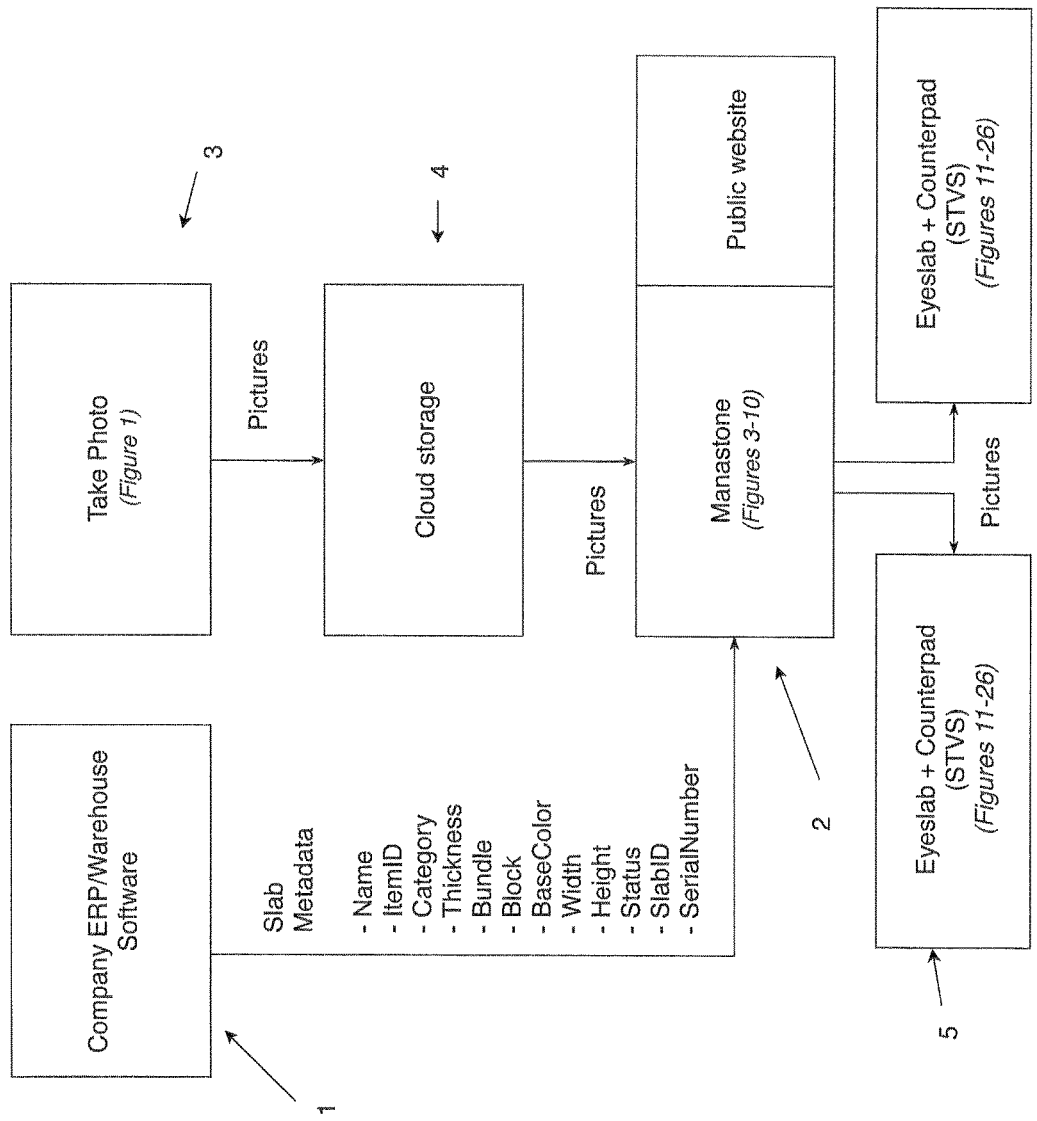
FIG. 1 is a flowchart giving an overall look to all the elements and how are they connected.

While the assembly and method of the present application is susceptible to various modifications and alternative forms, specific embodiments thereof have been shown by way of example in the drawings and are herein described in detail. It should be understood, however, that the description herein of specific embodiments is not intended to limit the Invention to the particular embodiment disclosed, but on the contrary, the intention is to cover all modifications, equivalents, and alternatives falling within the spirit and scope of the present application as defined by the appended claims.

DETAILED DESCRIPTION OF THE PREFERRED EMBODIMENT

Illustrative embodiments of the system for design visualization using actual product images are provided below. It will of course be appreciated that in the development of any actual embodiment, numerous implementation-specific decisions will be made to achieve the developer's specific goals, such as compliance with assembly-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention is a system (SBTS), that works in two different environments. A backend, comprised of the SIAS and the Manastone application, and then the customer faced systems, comprised of STVS, Eyeslab and Counterpad. In summary which each of these parts do is the following:

Slab Image Acquisition System (SIAS): Acquires photographies of the slabs.

Manastone: Stores them in a virtual warehouse connected to the company ERP system.

Stab TV system (STVS): The slab-sized monitor or monitors system.

Eyeslab software: A catalog application that works in combination with STVS so the user can see a 1:1 ratio of the real product, and do certain tasks like material comparisons etc.

Counterpad: Builds a visualization of stone applications like a countertops, walls etc, using the previously selected slabs and display them in 3D using the SIAS system. And finally creates a deliverable of that visualization (commonly known as "the rendering") to multiple formats like a summary document, 3d model or CAD Drawing.

The Stab Image Acquisition system (SIAS) consists of the following items/hardware:

A high resolution digital sensor camera,

A 100 mm lens

A lighting system comprised of:

At least 2 professional grade strobe lighting.

Multiple receivers (it's number is calculated using the following formula: no of strobes, +camera system+automated motor accessories)

One trigger to synchronize the shot.

A solid upright platform to secure the slab, for example an A-Frame

A green or blue backdrop

The Slab that will be photographed

The process to take the image is the following. The slab must be placed on an solid upright platform against the backdrop. The main 2 professional camera lights will be placed at 45 degree angles facing the slab at 5 feet from the ground. The distance between the Far edge of the slab, and either one of the strobes, should be in a range of 221-269 inches (the exact distance is calculated is according the color, texture, finish and aesthetic qualities of the slab).

In between the two lights and also facing the slab the camera is placed at four feet from the ground and 182 inches from the face of the slab attached to an automated motor accessory. A transmitter is then placed on each light as well as the camera itself, and optionally to the automated motor accessory allowing all the elements to sync together.

To achieve uniform lighting the individual light settings might fluctuate higher of lower to achieve a distributed light on the slab of 352 watts. Depending on the color, texture, finish, and aesthetic qualities white Softboxes will need to be deployed over the lights to evenly distribute the light.

The settings on the camera should be the following:

Shutter speed: 200

ISO: 100 to 160

Aperture: 5.6 to 13

With light colors such as whites, settings typically stay consistent. The aperture is at 13, the ISO is it 100, and the shutter speed is it 200. Sometimes however, settings may need to be adjusted With dark colors Aperture is going to vary between 5.6 and 7. Although the 5.6 setting is usually best for dark colors when the basecoat is either black or dark gray, for materials that have movement in the middle but no movement around the edges it is usually best to bump it up to a 7. Also, soft boxes should be used over the strobe light in order to get better distribution of the light throughout the slab. When this is done, it is important to move the lights back up to 48 inches (depending on the aperture) in a 45° angle away from the slab. Also, there is some variability with the ISO. Usually it sits at 100, but with some of the darker ones that have no movement and very tightly packed granules, it is best to move it to as high as 160. The consistency of the shutter speed is always 200.

Depending on the type of camera used, it's color sensitivity and resolution, a number of pictures between 4 and 12 need to be taken. They will then be stitched or layered together to achieve a single high resolution (between 50 and 100 megapixels) color accurate Image of the particular slab being photographed.

To stitch and/or layer the photographs, a professional grade photo editing software such as Adobe Photoshop and Gigapan Stitch is used.

Manastone is central part of the SBTS as it links all the pieces together. If we follow a timeline, from taking the photograph to displaying it to the client, Manastone does the following:

1. Gets a copy of the products of the company ERP software and their specifications. To be more exact, this is the minimum required Information:

Name: The material name, for example: Calacatta Borghini
ItemID: An unique material identifier, for example SBBK1213
Category: Stone type, for example: Marble.
Thickness: Thickness in CM, for example 3.
Bundle: The stone Bundle. A specific stone business grouping.
Block: The stone Block. A specific stone business grouping.
BaseColor: The stone main color, for example White.
Width: The width of the slab in inches, for example 102
Height: The height of the slab in inches, for example 51.
Status: Status of the material, for example "InStock" for available items.
SlabID: The company slab identifier, for example 1082-21
SerialNumber: The distributor slab identifier, for example: AB124-21.

2. Receives the image from SIAS, either by direct upload to the system or grabbing it from a configured cloud storage and mix-matches them with the inventory system, usually by comparing the Stab unique identifier, with the image name, which contains the same identifier. Then it processes that slab image into a handful of image formats for the following targets.

a. Website: Multiple thumbnails in JPEG format, and a big tiled image comprised of JPEG tiles of 256×256 taken at multiple zoom levels.

b. Counterpad: Uses a power of 2 sized thumbnail and a high-resolution image both formatted on the platform supported 3d texture format. For example, on a windows machine the thumbnail can be a 256×256 image, and the high-resolution image is a 4096×4096, both formatted to either JPEG or DDS.

Since the slabs are usually rectangular, and those images are square, the application pads them vertically with white pixels.

c. Eyeslab: Uses multiple thumbnails, a sample like image (a square area taken from the middle of the slab, imitating a physical sample). A big tiled image using the same format as on the website, but it's tiles are 1024×1024 pixels.

After generating all the file formats, the slabs are ready to be served in two fronts:

A builtin catalog website. That allows users to see the slabs in full resolution, via the internet.
Eyeslab and or Manastone. Those applications can request copies of the ages in their formats so they can work with them.

The software can optionally show directly slabs to customers, allowing authenticated users to create their selections, called projects without having to rely on Eyeslab or Manastone. Plus, it gives those users the ability to view and download the deliverables of those projects after they have been worked on the Eyeslab and or Manastone program.

Finally, it also serves as a deliverable generator, for the PDF, CAD and 3d formats and as a storage for the projects done in the Eyeslab and Counterpad programs.

Slab TV system (STVS) is a monitor, display, tv or any other device that can be used to display slab images in a 1:1 ratio. This can be either a single device or multiple devices put together where image is displayed across.

The area of the STVS must be no smaller than 40 square feet and no larger than 80 square feet and have a resolution of at least 720 dots per inch. A size outside these specifications won't allow to a 1:1 ratio with the sufficient resolution.

An example setup of this could be to use a 3×3 videowall comprised of 9 Planar Clarity Matrix 46 inch monitors with a total resolution of 5760×3240. In the event a multiple monitor system is used it is required to use a model with a consistent thin bezel between the screens to not hinder the user experience.

Eyeslab is a cataloguing software which is specifically designed for a smooth user-friendly and interactive stone sales experience.

To not overwhelm the customer with a huge variety of items, it takes a top-to-bottom philosophy, which begins when either a new project is created or a prior project is loaded.

To start with the user is provided options such as name, stone color, type of material or even first-letter filtering so the user can begin narrowing down the search of the desired slabs.

After this initial step, the user is presented with a list of images of samples of the materials that fit their search criteria. The purpose of the sample is to inform the user generally as to what the material looks like. If the user desires to see a random full-sized slab of any of that sample, it can be can seen it by clicking on the image.

Once the user has decided on the samples he's interested in, the user is presented with a list of bundles where he can see the first slab of each of the bundles from those materials. As in the previous step the user can then filter out the bundles he's not interested in.

Finally, he see's all the slabs of the selected bundles, and can view them in multiple ways:

Full screen (1:1 ratio) of the slab.
Side to side of two or four slabs. So that different slabs can be compared side by side. Or to see how a composition of them (usually called bookmatch) flows. Should the end user only desire to see images of those full slabs. Then this selection is finished. Otherwise, Eyeslab program kicks project into the counterpad software.

To be able to display the full-screen high resolution images taken by SIAS, Eyeslab makes use of a tiling image system, for example Deepzoom, similar to what classic mapping applications use. This allows Eyeslab to be able to display 1:1 ratio image as if the customer was physically standing in front of the slab, with a minimal load time. With this, the customer has access to hundreds of thousands of slabs that would take them weeks or months to view them physically a few seconds away from him.

Counterpad is a visualization tool, which allows a user to create and see realtime 2d/3d visualizations using the slabs previously selected on Eyeslab or the Manastone Website. The workflow is separated into five areas: Drawing, Layout, Edge Finishing, Final positioning and 3D-viewing.

Drawing. In this step, the user draws a 2d representation of the stone layout he wants to build using sample shapes. These shapes can be either simple shapes like Rectangles and circles or composite shapes, like for example and L-shape.

To achieve the desired layout, these shapes can be manipulated in multiple ways. First of all, there are some generic tools that are used through the application to allow navigating the 2d drawings. These tools apply to all the 2d views:

Drag: Allows to move the 2d shapes around.
Rotate: Allows to rotate the 2d shapes.
Pan tool: Lets the user move around the drawing.
Zoom tool: Lets the user get closer or further away from the drawing.
Layers: Since we're working with an orthogonal 2d drawing viewed from top, layers allow to separate multiple overlapping items into separate views.
Split tool: Lets you cut a shape into 2 or more pieces using a user-defined line segment that will show where the stone will be cut.

Then, the drawing step has some specific tools:

Size: Using handles or inputting the measurements an user can rescale a shape.
Edge: Using a special tool they can select the edges, and move them around, altering the look of the shape,
Boolean tools: An user can do boolean operations on the shapes to merge them together, remove a piece from another effectively making a hole.
Direction tool: Lets you transform a horizontal piece (countertop) to a vertical piece (backsplash).
Cutout tool: Lets you define the areas that will be cutout. For example, sinks, or fireplace firebox.
Copy and paste: Copy and paste like Microsoft applications like MS Word does with the difference that it doesn't use the operating system shared clipboard.
Tile tool: Lets you define an array of rectangular shapes, that are grouped together, mostly used for floor layouts.
Layout: This step is separated in two parts. The first part, also known as Material Selections, lets you define sets to work with a subset of the slabs the user has chosen. The second part, known as material layout, shows the materials drawn on the drawing step, and using the shared tools lets you layout the slabs on top of the actual slab, while giving a real time 2d preview on how it will look on the drawing.
Edge Finishing: In this step the user can select from a list of edge finishings and apply them to the edges he wants. This influences both the 2d view, where markings appear and the 3d view where the edges change to the desired finishing
Final positioning: because the application works on a 2d plane, to work in a more comfortable way they're not positioned as they should be on the 3d space, also some details like the distance from ground are not defined while drawing. This step allows the user to configure how the pieces will work together, and allows the user to set up the distance from ground, aside from extra details like simple cabinets under countertops.
3d viewing: The ultimate goal of the application is achieved in this step, as this step allows the user to get a 3d visual representation of the Installation with the slabs selected in previous steps. To achieve this the user can view the previously created Installation in 3D, being able move, rotate and zoom in and out on the model. There are tools to change the lightning, and load selections so the user can compare easily with other options.

Once the user is satisfied with the final outcome, a snapshot of the project is taken and the project is saved. The saving process includes storing snapshots of every slab and how the slabs are cut, an Image of the three-dimensional preview, and a two-dimensional preview naming all the pieces to allow identification on the slab pictures. All of this saved Information is sent directly to Manastone, which generates the deliverables to allow transmission of the Information directly to the user.

Referring to FIG. 1, A general look of the system is shown, which works as follows: Chronologically speaking, you start with feeding the slab Information to Manastone using the company inventory software (items 1 and 2). Later on using SIAS (item 3), you take the photo of the slab which then is uploaded to a cloud storage, for example amazon s3 (item 4). Once the picture is uploaded manastone downloads it into its server and processes it in multiple file formats (item 2) once the processing is done, the Information travels in two directions. First on the website module where it is available, and second to the STVS and Eyeslab+Counterpad applications (item 5). Using the slab+image Information received then Eyeslab+Counterpad can create projects. Which are stored in Manastone. Communication between items 1-2 and 4-5 is done using a RESTful API. Manastone (item 4) checks the cloud storage on regular intervals to see if there is any new pictures matching the slab id.

Figure 2:
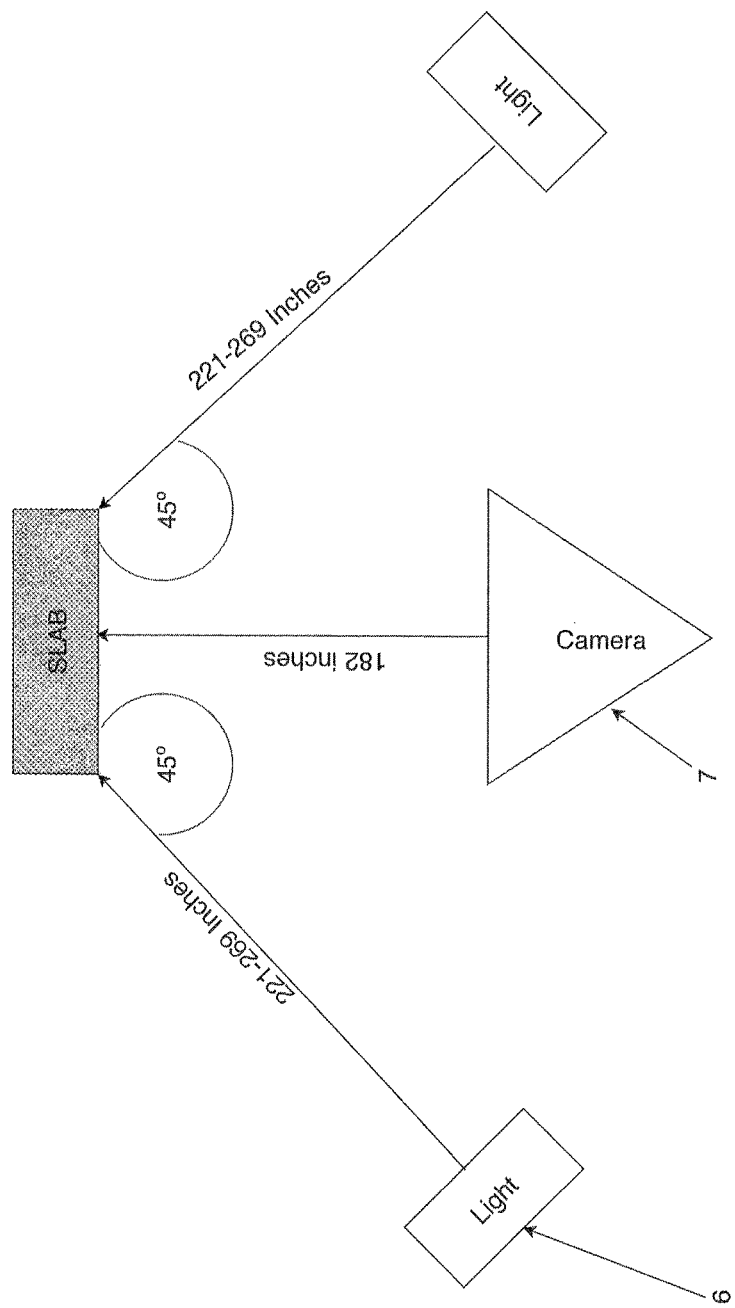
FIG. 2 is an example of the setup used for Slab Image Acquisition System (SIAS).

Referring to FIG. 2, The overall camera system setup is shown. The camera (item 7) is set up in the center facing the face of the slab, without any roll or pitch, at a distance of 182 inches as long as you're using a full-frame camera with 100 mm lenses. This distance may vary depending on the camera format and lenses.

If the material to photograph is light, the camera settings should be as follows.

Shutter speed: 200
ISO: 100
Aperture: 13

On the other side, on dark materials these should be:

Shutter speed: 200
ISO 100-160 (160 for materials with granules)
Aperture: 5.6-7 (7 is recommended with materials with movement in the middle)

The strobes (item 6) have to be positioned at 45° from the face of the slab and at a distance of 221-269 inches from it depending on the slab specifications. In light materials softboxes must be used to soften the light.

Figure 9:
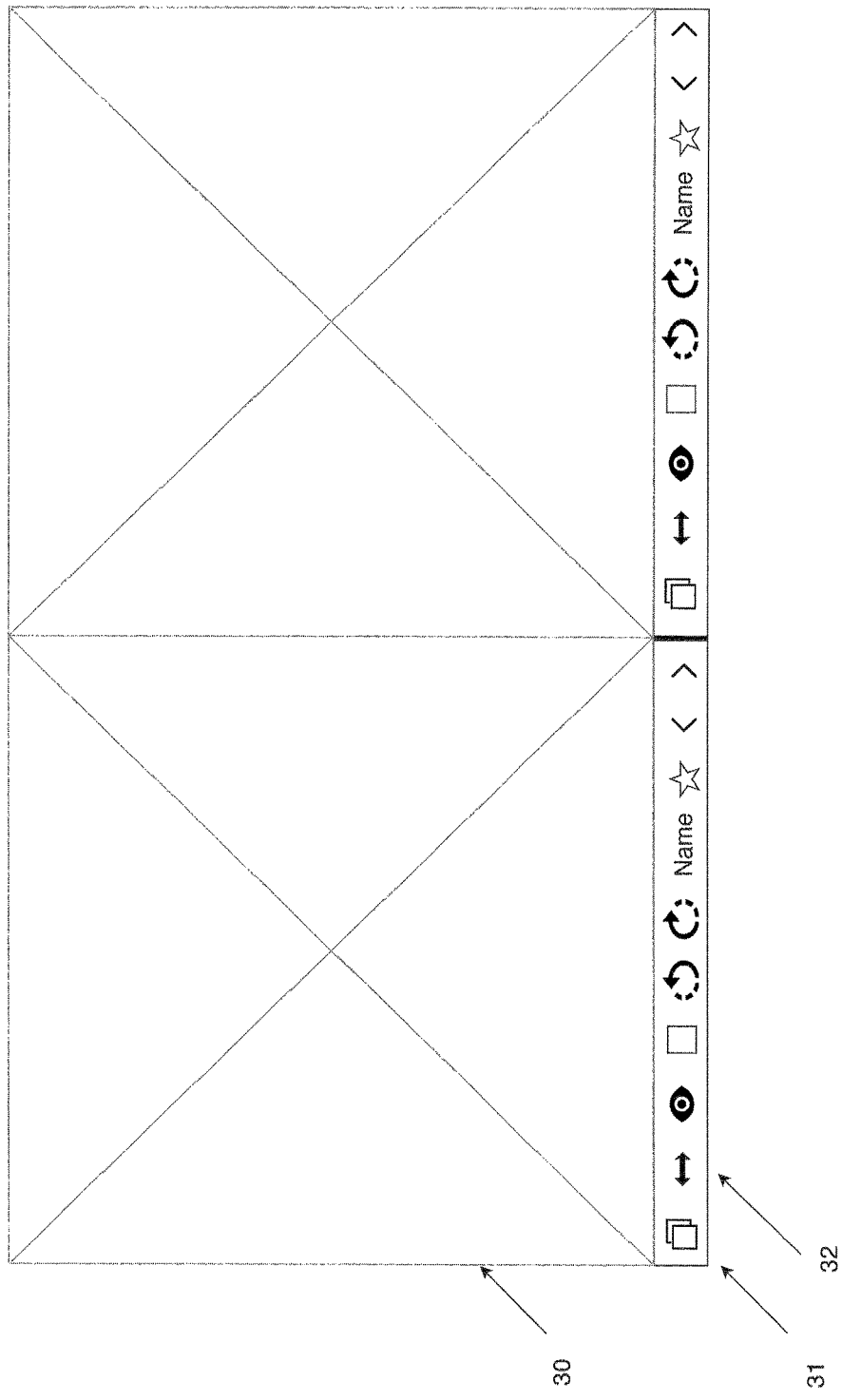
FIG. 9 is an example of the Eyeslab graphical user Interface for viewing two slabs next to each other.
Figure 10:
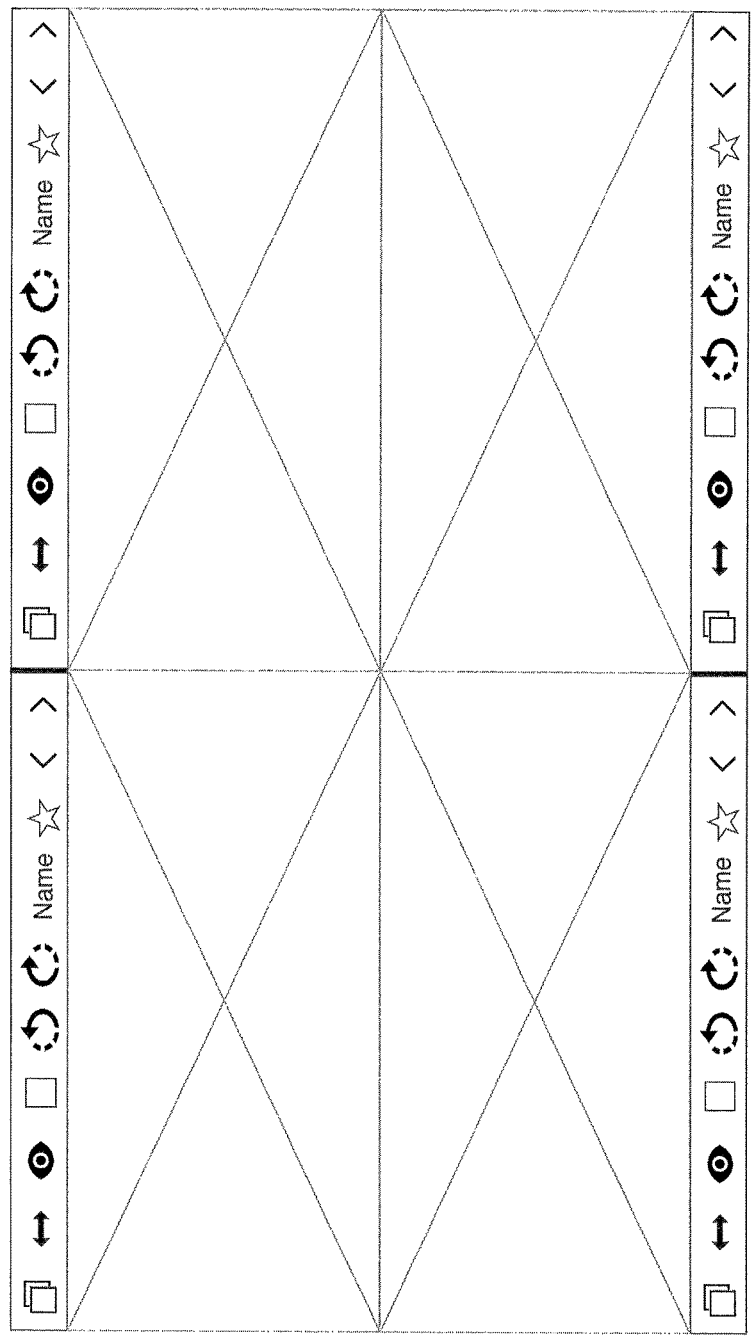
FIG. 10 is an example of the Eyeslab graphical user Interface for viewing tour slabs together in a 2×2 array placement.
Figure 11:
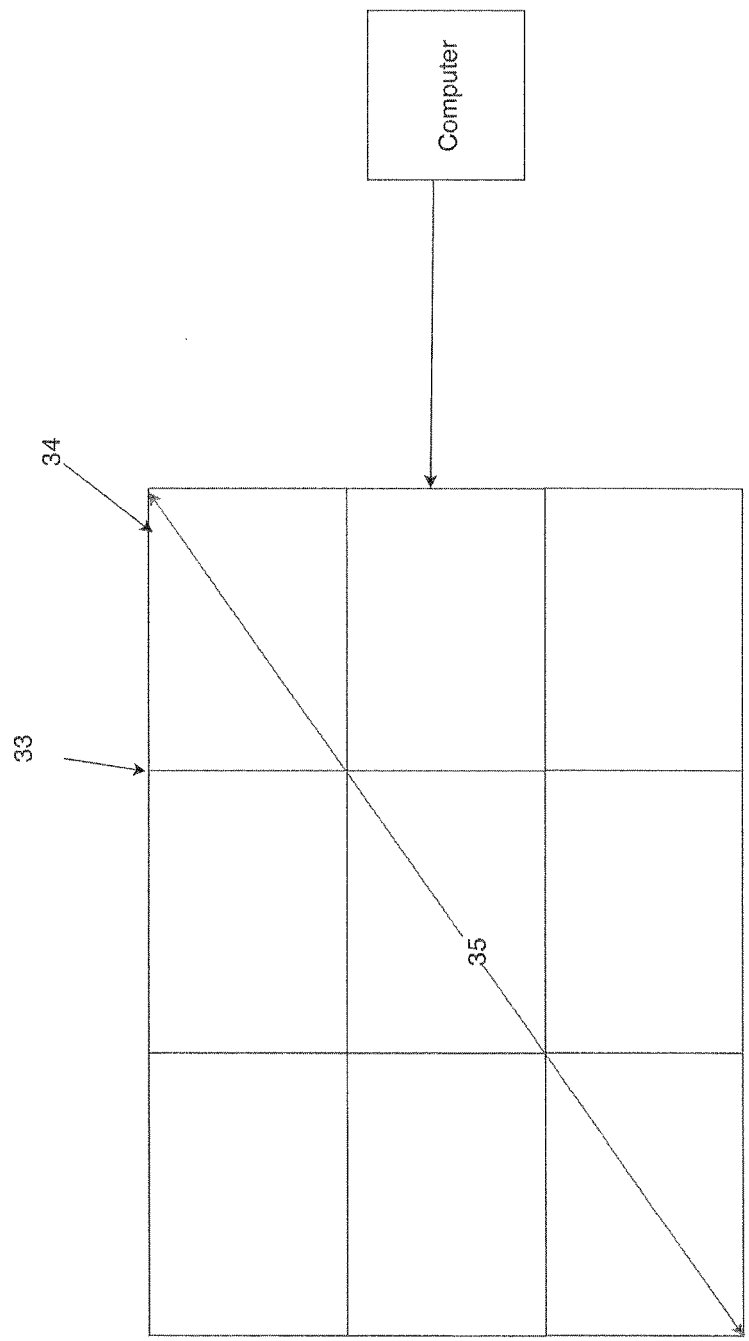
FIG. 11 is an example of a Slab TV System (STVS) System build using multiple monitors.

Referring to FIGS. 3-10 the Interface of the slab selection application Eyeslab is detailed, which alongside Manastone is designed to run on STVS (detailed on FIG. 11).

Figure 3:
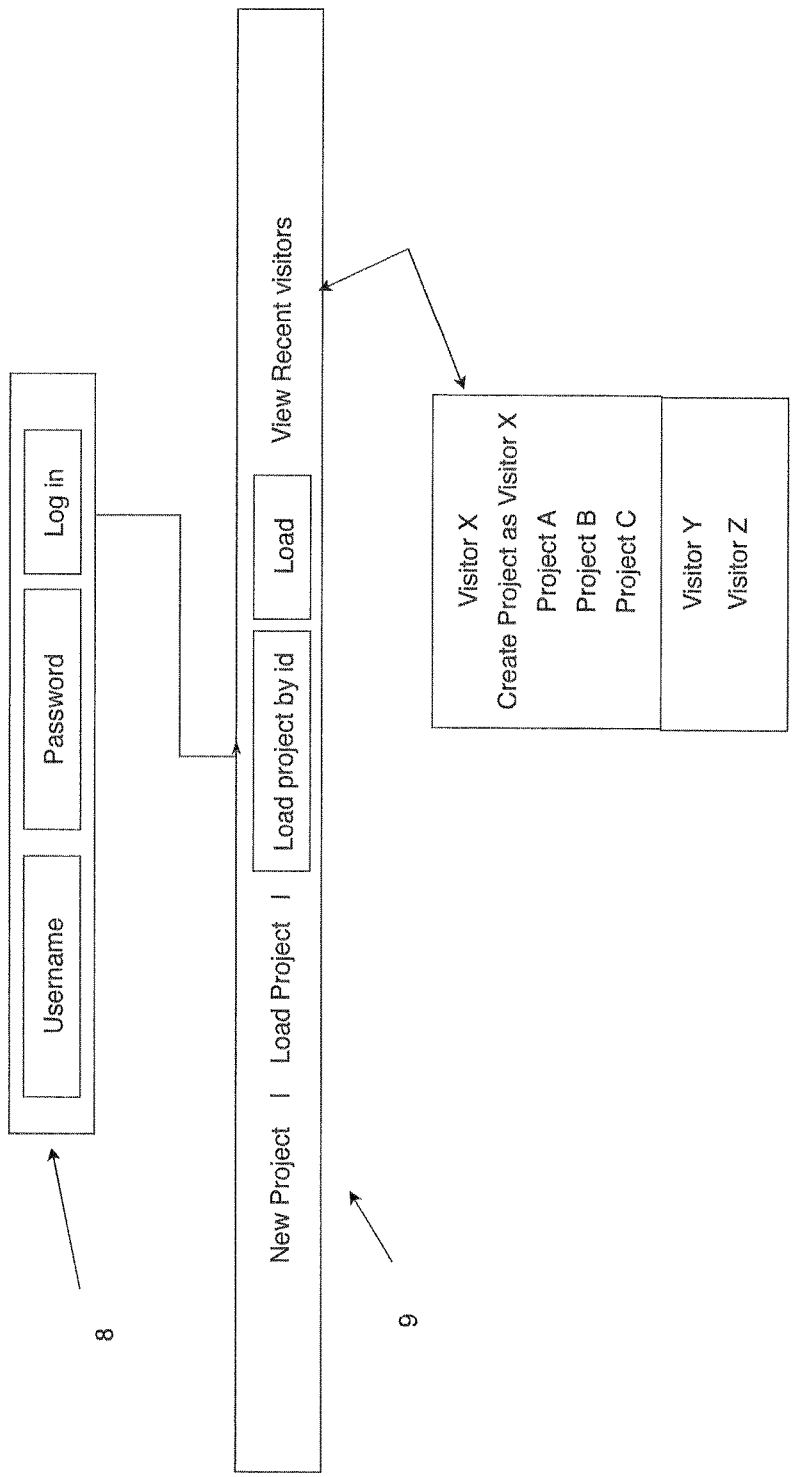
FIG. 3 is an example of the Eyeslab graphical user Interface for creating a new project or loading a previously-created project using the present Invention.

FIG. 3 is the initial step the user will encounter. In that step they first need to identify themselves (item 8) to avoid unauthorized usage of the system. After the user has identified itself they're presented with a new screen (item 9), which lets them do 4 actions:

Create a project: The user is asked for the name of the project and taken to FIG. 4. Interface.
Load last project: The user will be taken to FIG. 4. Loading the last project that was created on that precise application.
Load project by id: The user can load a project with a certain id, previously known by this user. Being taken to FIG. 4.
View recent visitors: The user is taken to a list of showroom visitors, which they can click, see their most recent projects, and load them by clicking on the project name. Which takes the user to FIG. 4.

Referring to FIG. 4. The first user-choice in the project is made. The screen shows a list of possible filter that can be used, like material name, type, color. which lets them narrow the search. and give them a segregated list of the products they're looking for. Once they finish doing this preselection they can press the next button, which takes them to FIG. 5.

Figure 5:
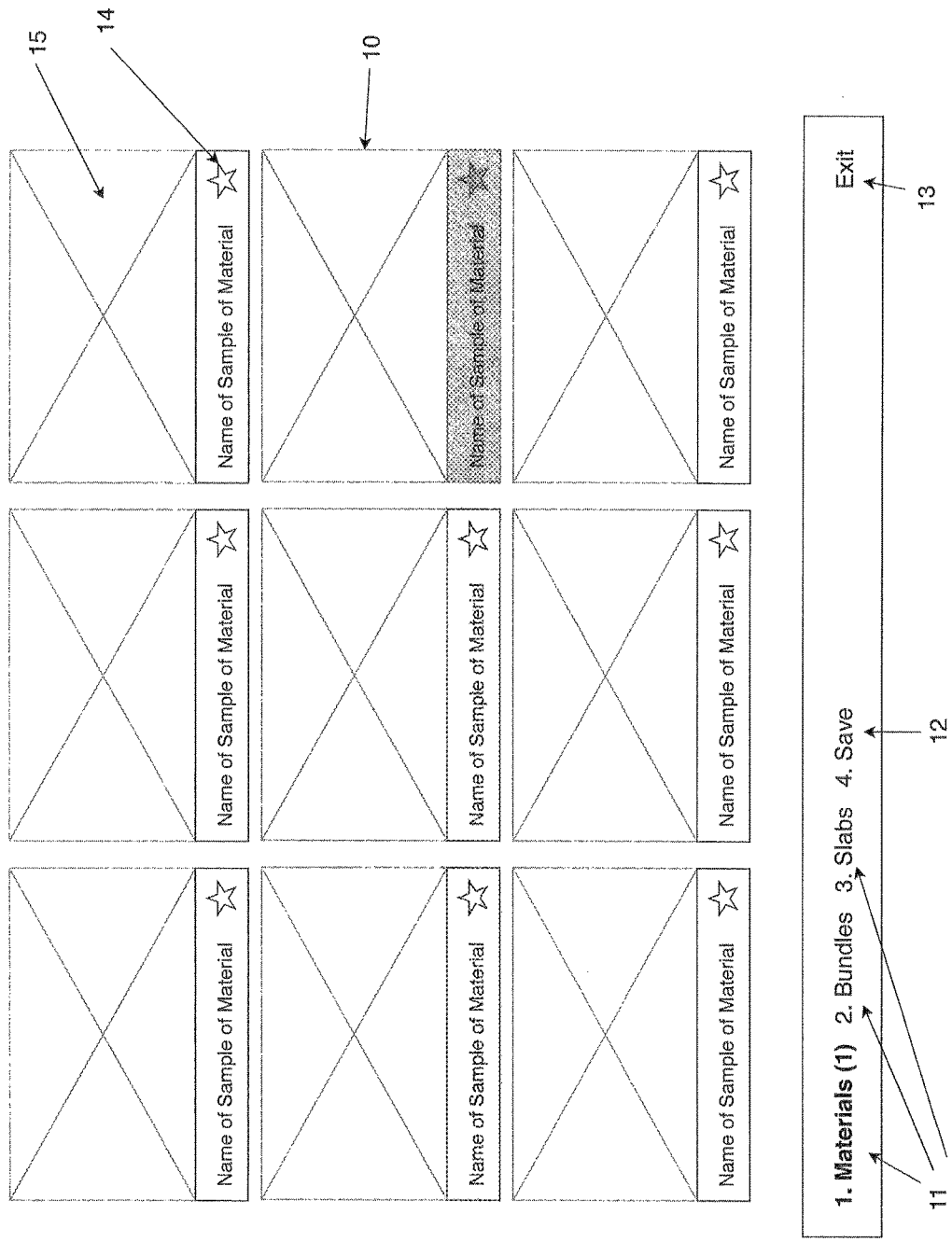
FIG. 5 is an example of the Eyeslab graphical user Interface for selecting a material to be used in a project using the present Invention.
Figure 8:
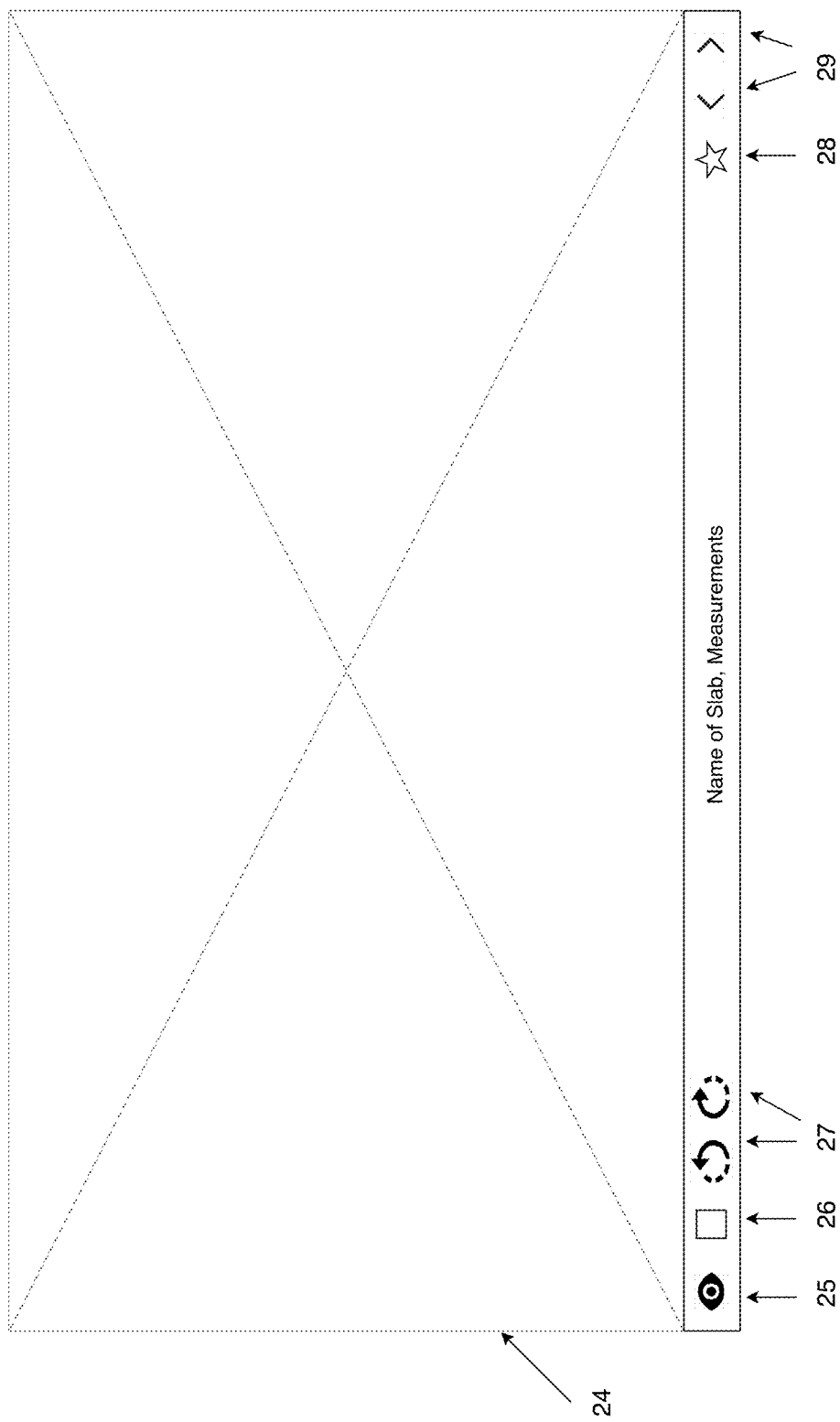
FIG. 8 is an example of the Eyeslab graphical user Interface for viewing the slabs in a 1:1 ratio.

Referring to FIG. 5. The user is presented with a list of Materials, where they can see a small sample sized picture of each of the materials (item 10) along with the name of it. If the Laser likes or is interested on the material he can click on the star icon, and it's state will change to reflect the item is selected, similar to what happens with item 10. If the user clicks on the picture (item 15), they will be taken to a 1:1 slab preview of a slab of this material (FIG. 8).

If the user want to go back to FIG. 4, they can press a keyboard key. They can press the exit button (item 13) to close the application and go back to the initial state of FIG. 3. If they want to save the project in any current state they can press the Save button (item 12). And finally item 11 is a navigation menu that allows you to move between the screens presented by FIG. 5-6-7. As long as you have items on each of it's levels. So if you don't have any Material selected you cannot go to the Bundle level (FIG. 6), and if you don't have any bundle selected you cannot go to the slab level (FIG. 7). Also to let know how many items are selected at a given time, the user is presented with a counter of the selected items next to each button.

Figure 6:
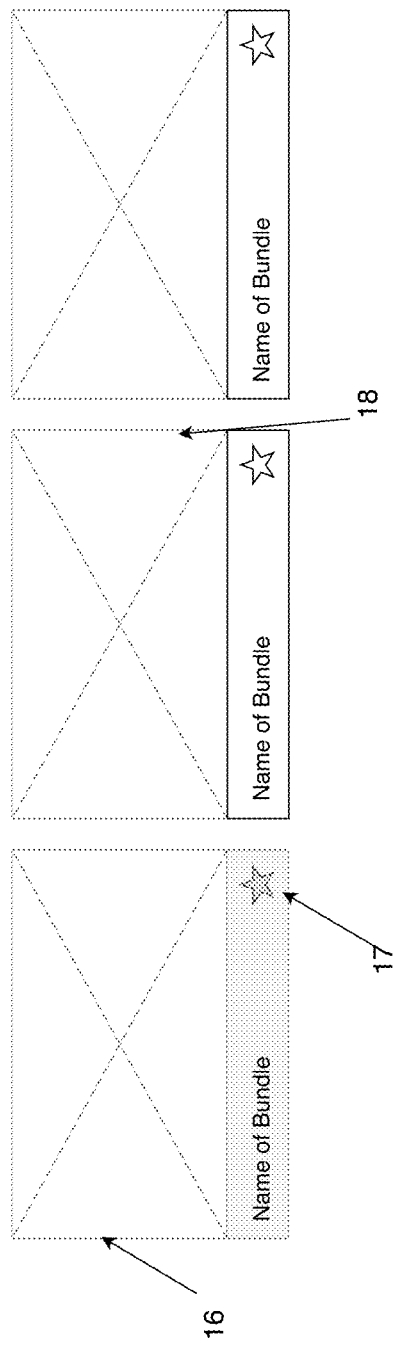
FIG. 6 is an example of the Eyeslab graphical user Interface for selecting a filtered list of bundles of previously selected materials using the present Invention.
Figure 6:
Figure 7:
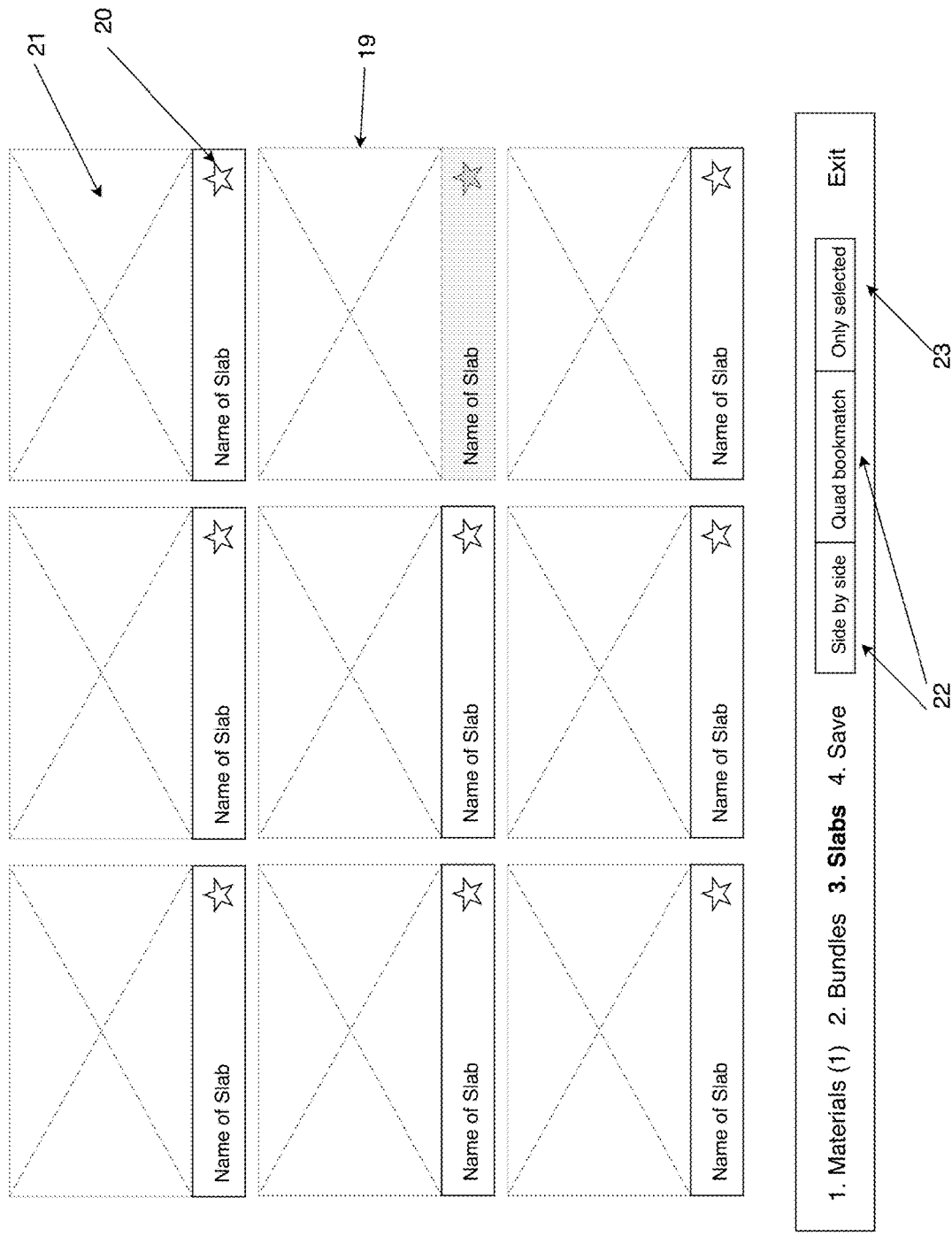
FIG. 7 is an example of the Eyeslab graphical user Interface for selecting a filtered list of slabs, from a certain list of bundles from a certain list of materials to be used in a project using the present Invention.

Referring to FIG. 6. The user is presented with a very similar interface as FIG. 5, but there are some important changes. First, the pictures (item 16) won't be material samples but the first slab of the bundle that the picture is representing. As with the previous steps, you can click on a star icon (item 17) to select it, or the picture (item 18) to go to a 1:1 preview of that first slab which takes you to FIG. 8.

Referring to FIG. 7. The user is presented with a very similar interfaces as FIGS. 5 and 6 with a few extra actions. First of all the items displayed are each of the slabs from the bundles selected on FIG. 6. Item 19 shows how a selected item using the star icon (item 20) looks like.

Item 22 lets you segregate the selections and only display the slabs that have been selected using the star icon (item w0). If you click on the image of the slab (item 21). You'll get redirected to FIG. 8-9-10 depending on the status item 22 buttons. If none of the buttons (item 22) are selected. It will show a 1:1 single slab view, FIG. 8. If side by side is selected, it will split the screen in two parts and switch to FIG. 9. If quad bookmatch is selected it will split the screen in four parts and switch to FIG. 10.

Referring to FIG. 8. Once arriving to this screen the user will find a 1:1 slab visualization (item 24), which can be zoomed in and dragged around. There's also displays to show the slab information like the material name and the exact measurements of the slab. Aside from that, there's some basic tools to rotate (item 27), zoom in (item 26 and mouse scroll wheel), select the item (item 28), hide the Information bar (item 25). They can also other things like navigating forward and backward in the current screen selection (FIG. 5-6-7) with the arrows buttons (item 29).

Referring to FIG. 9, and FIG. 10. The usage is pretty much the same regarding the slab visualization (1:1 ratio) but there's some extra actions to accommodate the Side by side preview (FIG. 8), and quad bookmatch (FIG. 9).

This screens serve a two purposes 1. Build combinations of the same material in a mirrored way known as bookmatch, 2. compare multiple materials side by side.

On FIG. 8, the button at item 31, lets you change from seeing the slabs side to side (item 30) or quad bookmatch to the format from FIG. 1. The action on Item 32 allows you to swap between the photographies on each of the screens with their opposite.

Referring to FIG. 11. There's an overview of a sample STVS system, using off-the-shelf solutions. A 3×3 array of 46-49 inch screens (item 34) is used to create a large format display having an approximate diagonal of 140 inches, in a 16:9 aspect ratio, getting an approximate 1:1 size with slabs (item 35). Using multiple HDMI cables a computer with Counterpad and Eyeslab is connected to it.

One thing that must be taken in care is that the screens must be calibrated for uniformity, and that the bezels between screens shouldn't be higher than 3.5 mm (item 33).

Referring to FIGS. 12-26, the interface of the Counterpad application is detailed. To create a project with this application there needs to be some slab selection (Project) created either using the web module of Manastone, or Eyeslab.

Figure 12:
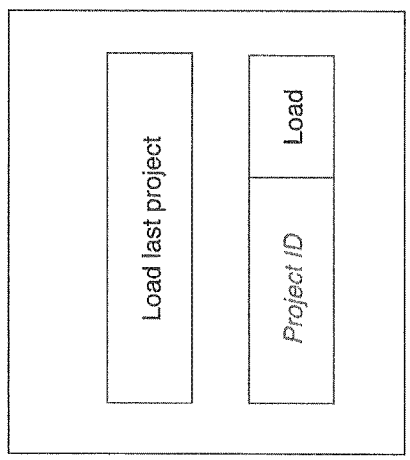
FIG. 12 is an example of the Counterpad graphical for loading previous selected slabs on Eyeslab or the Manastone website module to start drawing the stone application.

Referring to FIG. 12. The user is presented with the option to load the last project created on that STVS or to load a previously created project with slabs. In case there were no previously created sub-projects (selections from now on) with counterpad on this project, the application will take them to the drawing step (FIG. 13-14-15-16) Otherwise he will be taken to the material selection FIG. 19.

Figure 13:
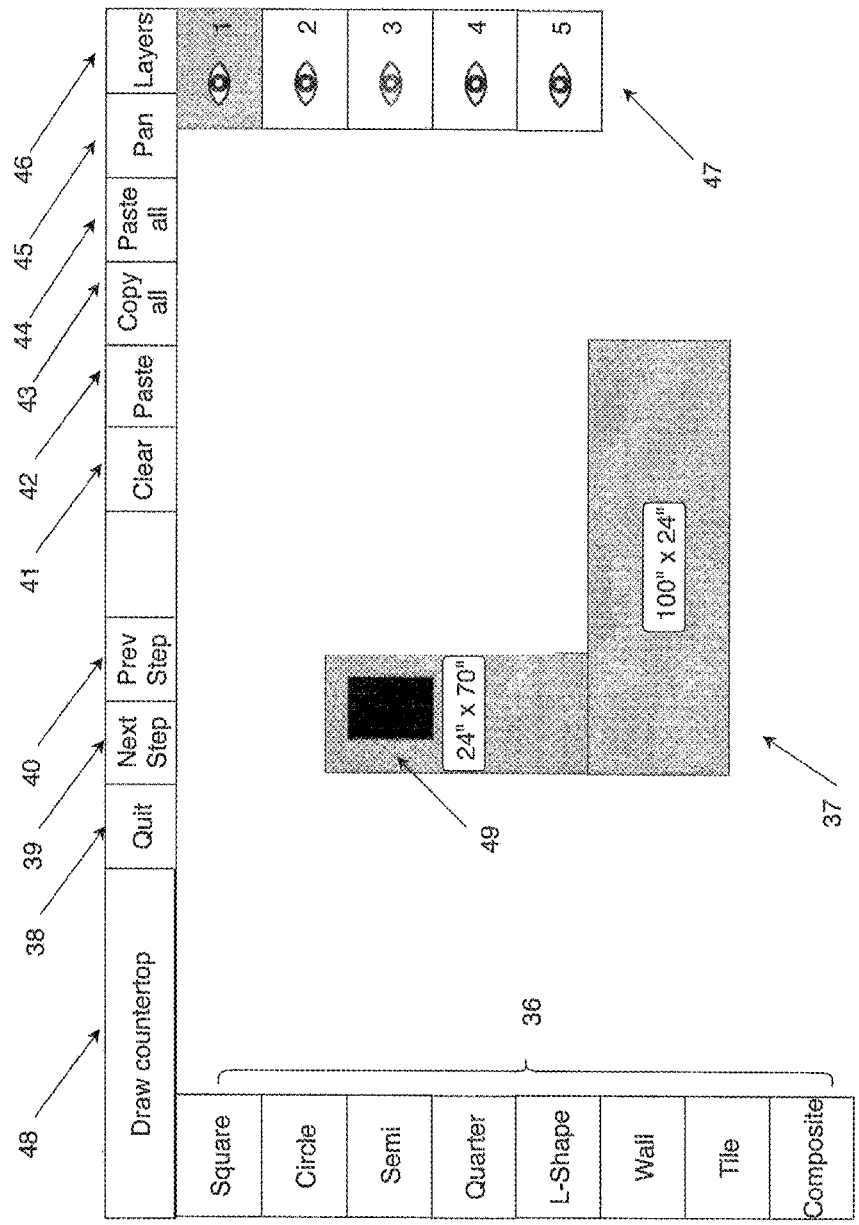

Referring to FIG. 13. After loading the slabs images that will be required on this project the Interface presents the user multiple tools.

The common feature of the application is the top-bar (where items 38 to 46 are) which is kept during all the design lifecycle. The top bar is separated in 3 main areas. First the step name (item 48), which tells the user in which part of the application he is. Second is the navigation part, which lets the user to navigate to the next (item 39), previous step (item 40) or quit and go back to the beginning of the application (FIG. 12). And finally there's the toolbar (items 41 to 46), which lets the user interact with the drawing area (item 37).

Figure 14:
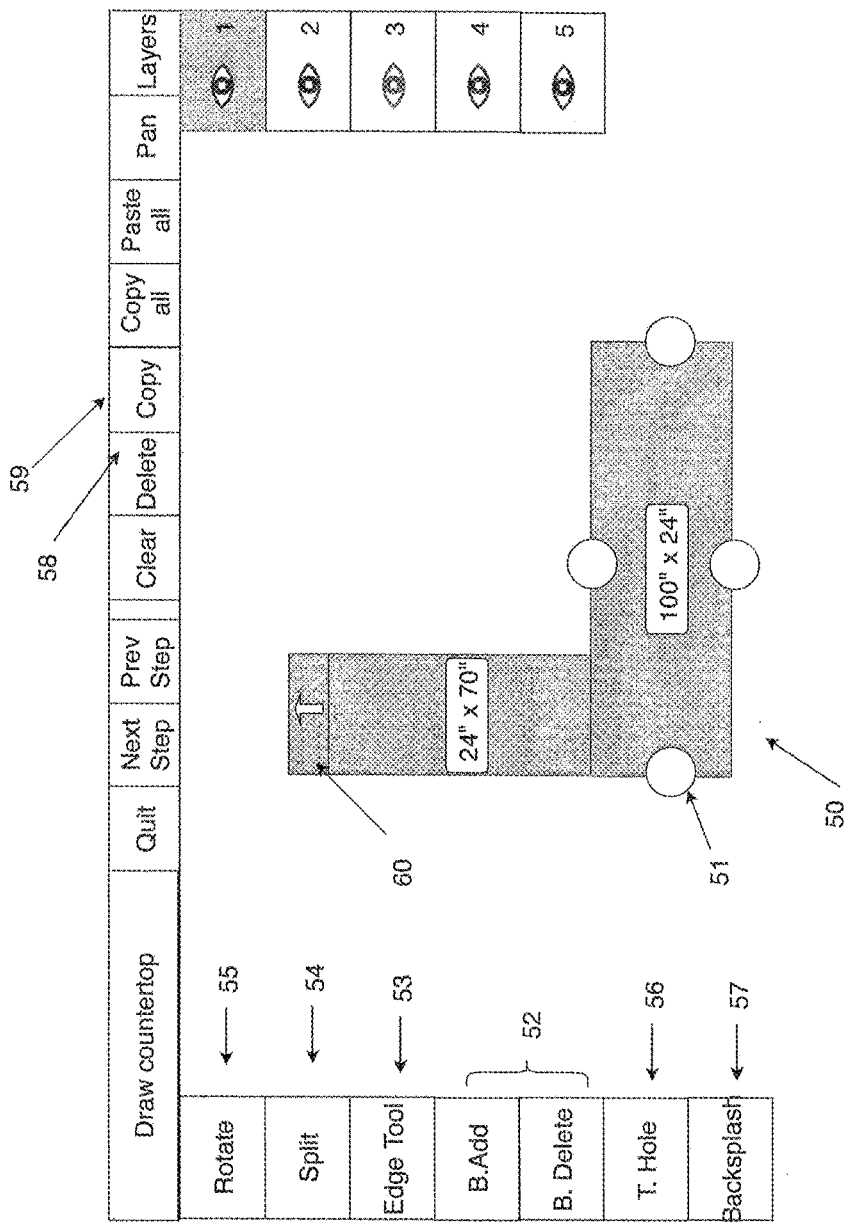
FIG. 14 is an extension of FIG. 13, showing how the graphical user Interface changes when a item is selected.

Item 36 is a tool palette where the user can drag and drop multiple simple or composite shapes into the drawing area, an example of those shapes can be seen in item 37, which can be selected by clicking on it, changing the interface to the state on FIG. 14.

Item 37 depicts the drawing area where 2 countertops and a cutout (item 49) are placed. All items have their measurements in a label that can be hidden. The color of the item depends on the layer it is set. You can assign items to any layer by using a keyboard shortcut or right clicking on it and selecting the new layer.

To control the current layer or show/hide layers easily the user can use the buttons on item 46.

The rest of the toolbar buttons work as follows:

Clear (item 41). Removes all stone surfaces from screen
Paste (item 42) Pastes a countertop that was previously selected and copied (FIG. 14 item 59).
Copy all (item 43) makes a copy of all the drawn items on the application clipboard.
Paste all (item 44) restores items.

There are some extra options to edit the shapes. To do that, you must click the shape (item 37) which leads to FIG. 14. Or right clicking it which leads to FIG. 24.

Figure 15:
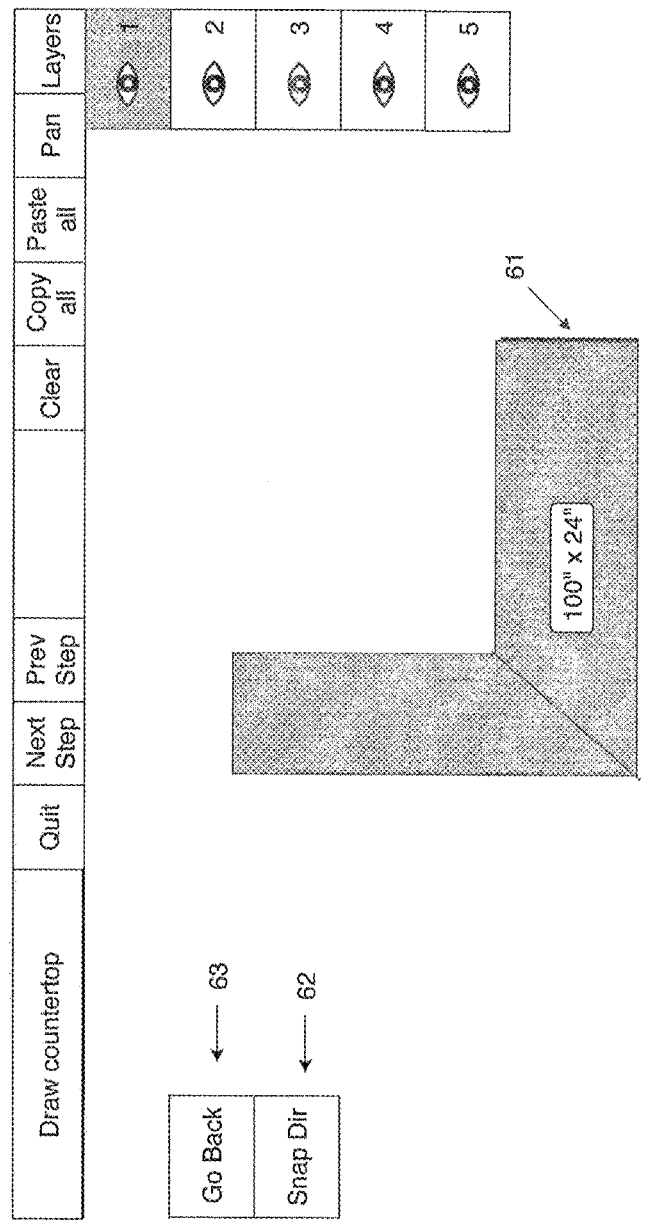
FIG. 15 is an extension of FIG. 14, showing how the graphical user Interface changes when the edge tool is activated.
Figure 16:
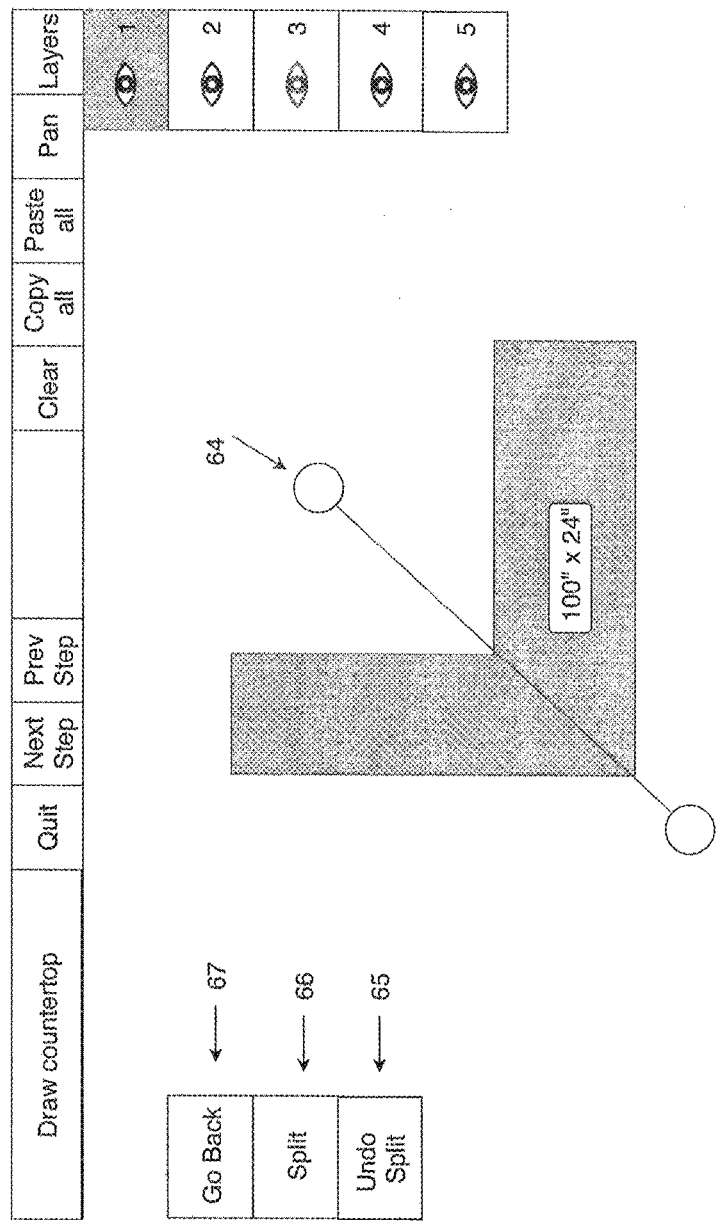
FIG. 16 is an extension of FIG. 14, showing how the graphical user Interface changes when the split tool is activated.

Referring to FIG. 14. It displays how the UI changes from FIG. 13, when you select an item, in this case Item 50. First of all, the toolbar changes from being able to create shapes, to add extra features (items 52 to 57). The tools do the following:

Rotate (item 55): Rotates in 5 degrees the countertop.
Split (item 54: Activates the Split tool (FIG. 16.)
Edge tool (item 53) Activates the Edge tool (FIG. 15.)

B.ADD B.Delete (item 52), activates the boolean operation tools (FIG. 17 and FIG. 18)

Transform into Cutout. (Item 56). Turns the current selected shape into a cutout. (like item 49 of FIG. 13).

Backsplash (Item 57). Transforms the current item into an item that will be drawn vertically (item 60). Backsplashes have an arrow that indicate the side of the slab where they are placed.

To indicate which is the active selected shape and to allow the user to transform the shape, 4 circled shapes will appear on each side of the piece (item 51) allowing the user drag them, which scales them in the direction they are. This can be used to resize shapes easily. If the user wants to move the selected piece (item 50) around they can drag it around and they will follow the mouse. The top bar also accommodates new icons to allow to copy to clipboard the current shape (item 59) or delete it (item 58) which brings the user back to FIG. 13.

Referring to FIG. 15. It displays how the UI changes from FIG. 13, when you enable the Edge tool. This tool allows you to edit a figure by dragging any of its edges. For this, the user must click on the edge they want to edit (item 61) and either drag it around or right click to be led to FIG. 25. If the user decides to drag it around, it is recommended to use the snap direction button (item 62). Once the user is done they can just go back clicking the go back button (item 63).

Referring to FIG. 16. It displays how the UI changes from FIG. 13, when you enable the Split tool. This tool allows you to cut a figure in two. This is mostly useful when a user wants to define some cuts on the stone. This tool is also used on the assign material step where it is used to cut pieces that don't fit the stone.

Figure 25:
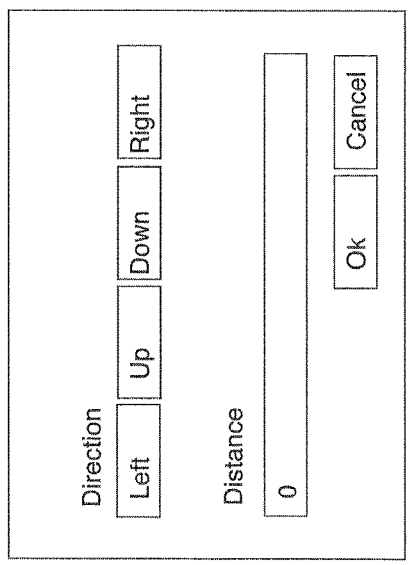
FIG. 25 is an example of the Counterpad graphical user Interface for transforming an edge on FIG. 15.

The usage of the tool works around using a slicing segment, which can be moved by the user by dragging any of the ends by clicking and dragging the handles (item 64). Once the position for the cut is determined, the user just needs to click the split button (item 66) and he will be taken back to the previous ui state (FIG. 13 or FIG. 25).

If they want to do a previously done split done on the piece the user can just click undo split (item 65). Otherwise, if they want to go back without making any changes they just need to click on go back (item 67).

Referring to FIGS. 17 and 18. It explains how the boolean operations from FIG. 13 work. On FIG. 17 we have the boolean add operation. The first step (item 68) is having two shapes overlapping or next to each other, when the tool is executed it will merge both of them creating a new one that is the sum of the previous two shapes (item 69).

In case of FIG. 18. The opposite is explained (item 70). In this case the second shape is subtracted from the first shape, creating an inset on the piece (item 71).

Figure 19:
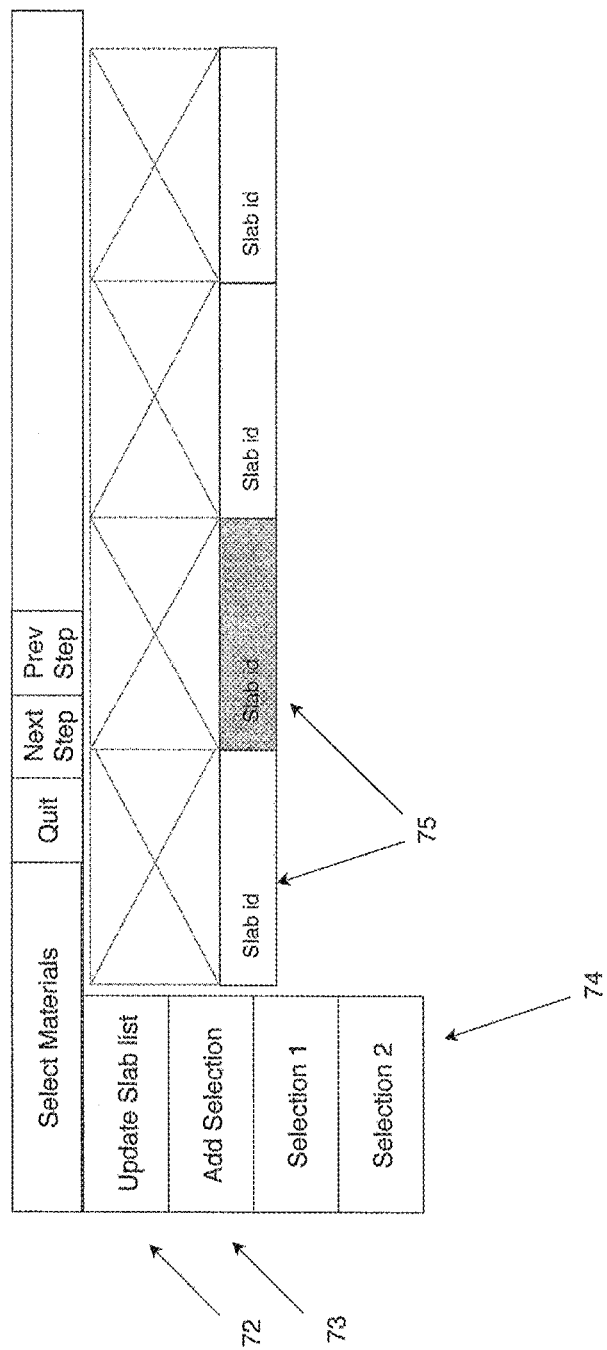
FIG. 19 is an example of the Counterpad graphical user Interface showing how to select the slabs that will be used to apply for what was drawn on the step displayed on FIG. 13.

Referring to FIG. 19. It displays how the UI changes when it goes to the next step after the initial drawing is complete. To get there, the user needs to click on the Next Step button (FIG. 13, item 39), or the back button (FIG. 13, item 40) if they're coming from the Assign material step.

This step functionality is very simple, the user is offered two lists. 1 is the list of slabs for this project (item 75). And the other one is an expandable list of selections (item 74). A selection or set is just a group of slabs that will be paired with the drawing. This is more clear explained with an example. Let's imagine we have an L-shape kitchen drawn on the previous step and we want to see two options of that kitchen, with slabs 1 and 2. and another option with slabs 3 and 4.

To achieve that the user has to create a selection by clicking the add selection button (item 73). Then, click the Selection 1 button and then click on slabs 1 and 2. The same procedure is done with the second selection, except the user selects slabs 3 and 4. Once he's finished adding slabs, he can choose the selection he wants to work on, and click the next step to go to the assign materials step.

In case the user wants to go back to eyeslab and add new slab selections, the reload button (item 72) will update the selection on this application.

Figure 20:
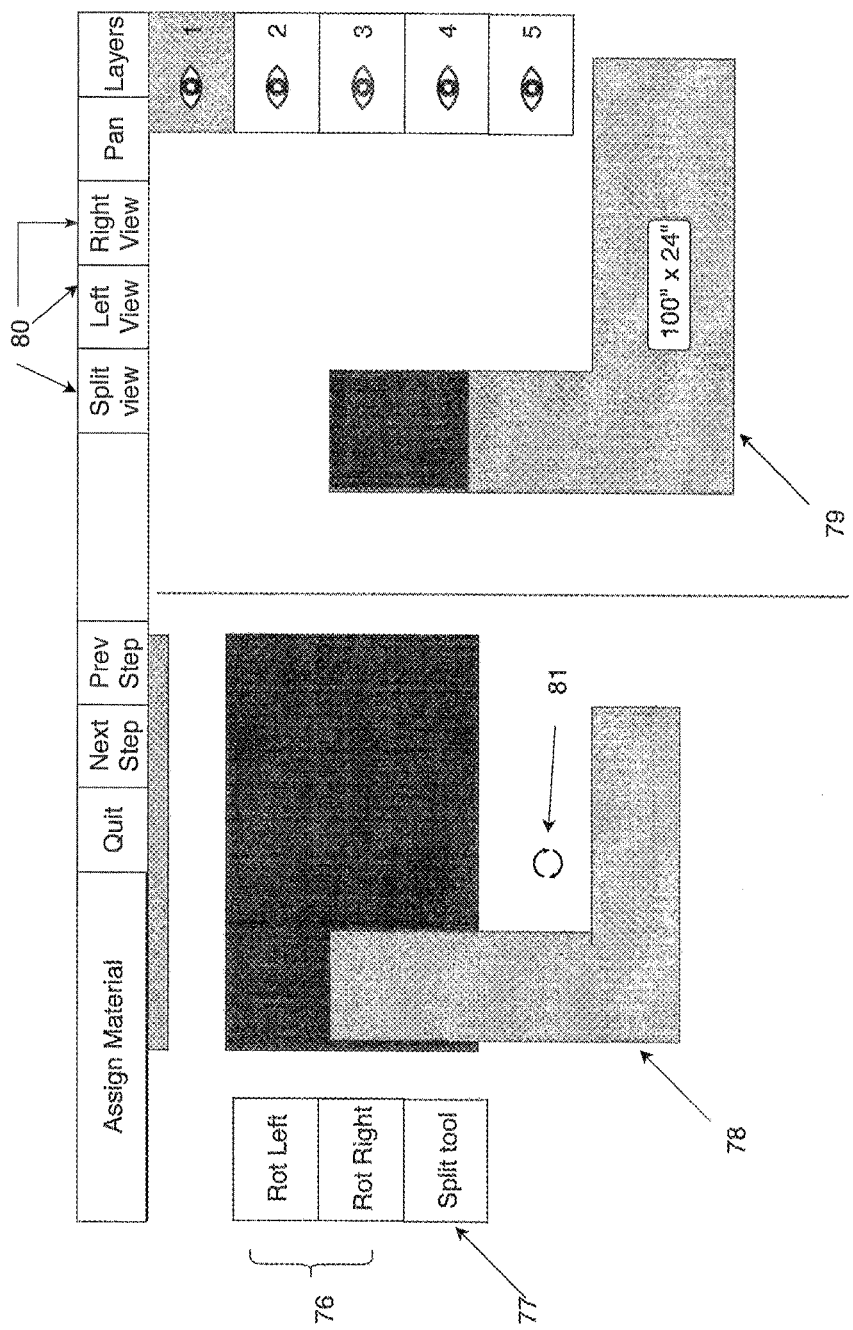
FIG. 20 is an example of the Counterpad graphical user Interface showing how to apply the stone surfaces drawn on the step of FIG. 13 on top of the slabs the slabs selected on the step of FIG. 19

Referring to FIG. 20. It displays how the UI changes when it goes to the next step (Assign material) after selecting the slabs the user will be working on. To get there, the user needs to click on the Next Step button (FIG. 13, item 39), or the back button (FIG. 13, item 40) if they're coming from the Edge finishing step.

The assign material step is where the user applies the previously drawn shapes to the stone slabs. In this step the UI is split in two parts. On the right side, the user gets the overall 2D view of the countertops with the materials already applied (item 79). On the left side the user gets all the drawn pieces and the slabs (item 78), where he can drag them around on top of each, which applies the material as if the slab was cut on the piece using the shape. If the user wants to rotate the slab precisely, there's a handle he can use (item 81).

In case the user wants to see only of the two screens of a time he can press the Split/Left/right view buttons (item 80) to change the current view. There's also a toolbar on the right (items 76 to 77) with the following actions.

Rotate left. Rotates the selected countertop 90° to the left or Right. (item 76)

Split tool. Opens a split tool, like on FIG. 16). (item 77)

Figure 21:
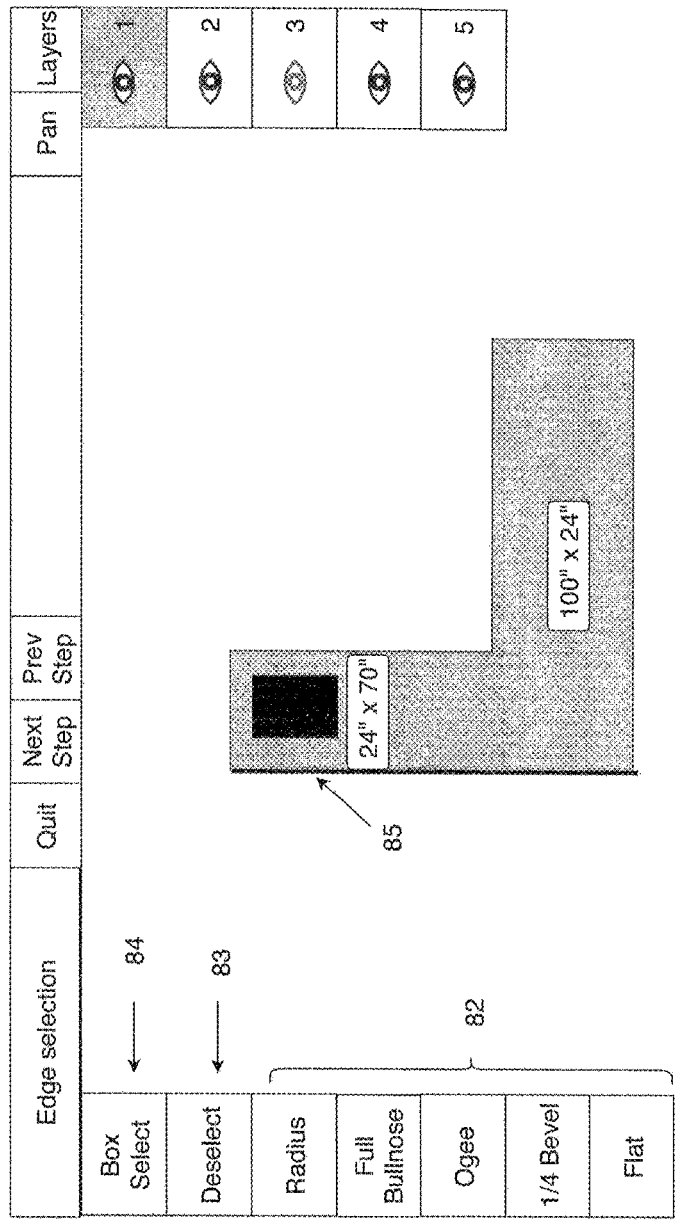
FIG. 21 is an example of the Counterpad graphical user interface showing how to apply edge finishings to the output of the step of FIG. 20.

Referring to FIG. 21. It displays how the UI changes when it goes to the next step (Edge selection). To get there, the user needs to click on the Next Step button (FIG. 13, item 39), or the back button (FIG. 13, item 40) if they're coming from the 3d Position step.

The edge selection step lets the user choose stone edge finishing. The user only needs to select the edge finishing he wants to apply (Item 82) and then click on the edges where he wants that edge finishing applied (item 85). To speed up edge selection the user can also use a box select and deselect tool (items 84 and 83 respectively).

Figure 22:
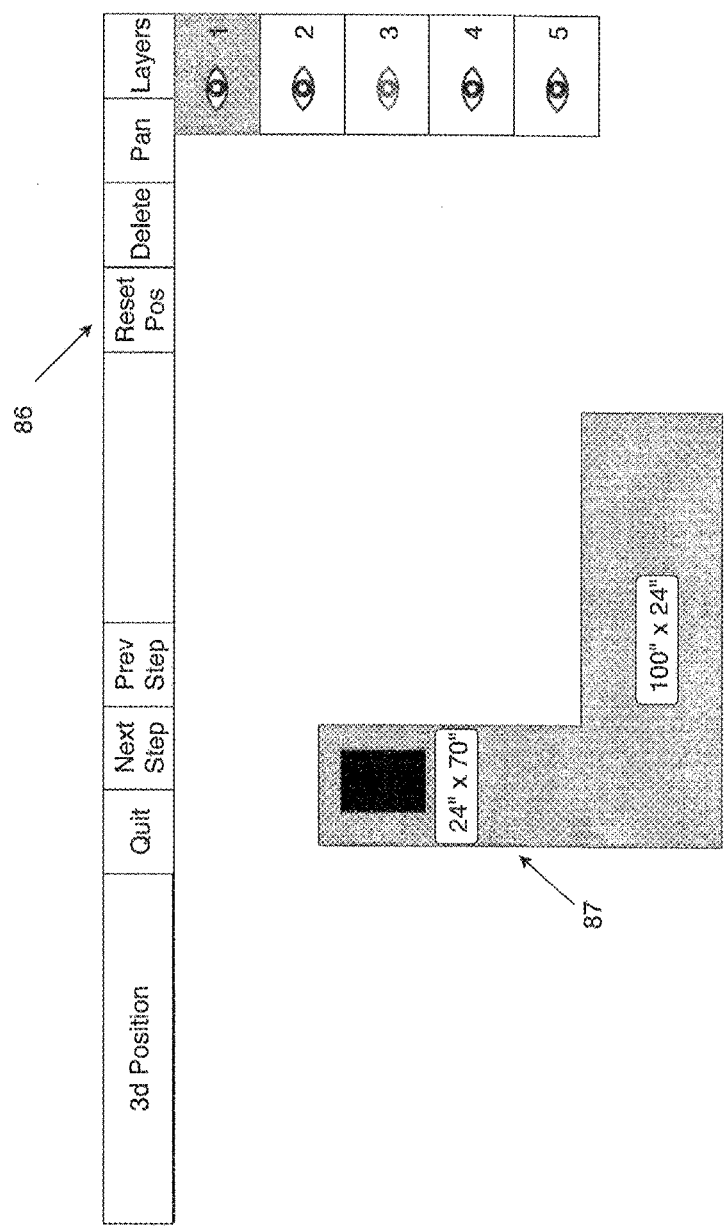
FIG. 22 is an example of the Counterpad graphical user Interface showing how to do the 2d to 3d positioning to the output of the step of FIG. 21.

Referring to FIG. 22. It displays how the UI changes when it goes to the next step (3d Position). To get there, the user needs to click on the Next Step button (FIG. 13, item 39), or the back button (FIG. 13, item 40) if they're coming from the 3d view step.

Since the drawings are generated from a topdown view and not a 3d one, the user may find itself limited on previous steps on elements like: stacking items on top of each other, or designing vertical surfaces. This step allows you to draw the items in a more comfortable, topdown way and then once arriving here, be able to stack them and position them the way they're going to look on the 3d view.

So in summary this step lets you arrange any items, like item 87 around in the way they will be displayed on the 3d view, plus adding some features that they will be impossible otherwise, like distance from the ground, or select simple shapes to represent cabinets.

To arrange the items the user has 3 tools.

1. Click and drag a shape.
2. Right click which lets them access the FIG. 26. Menu which lets the user do a fine tuned movement, set cabinets and or set the distance of the piece from the "floor".
3. Reset all changes done by clicking on item 86.

Figure 23:
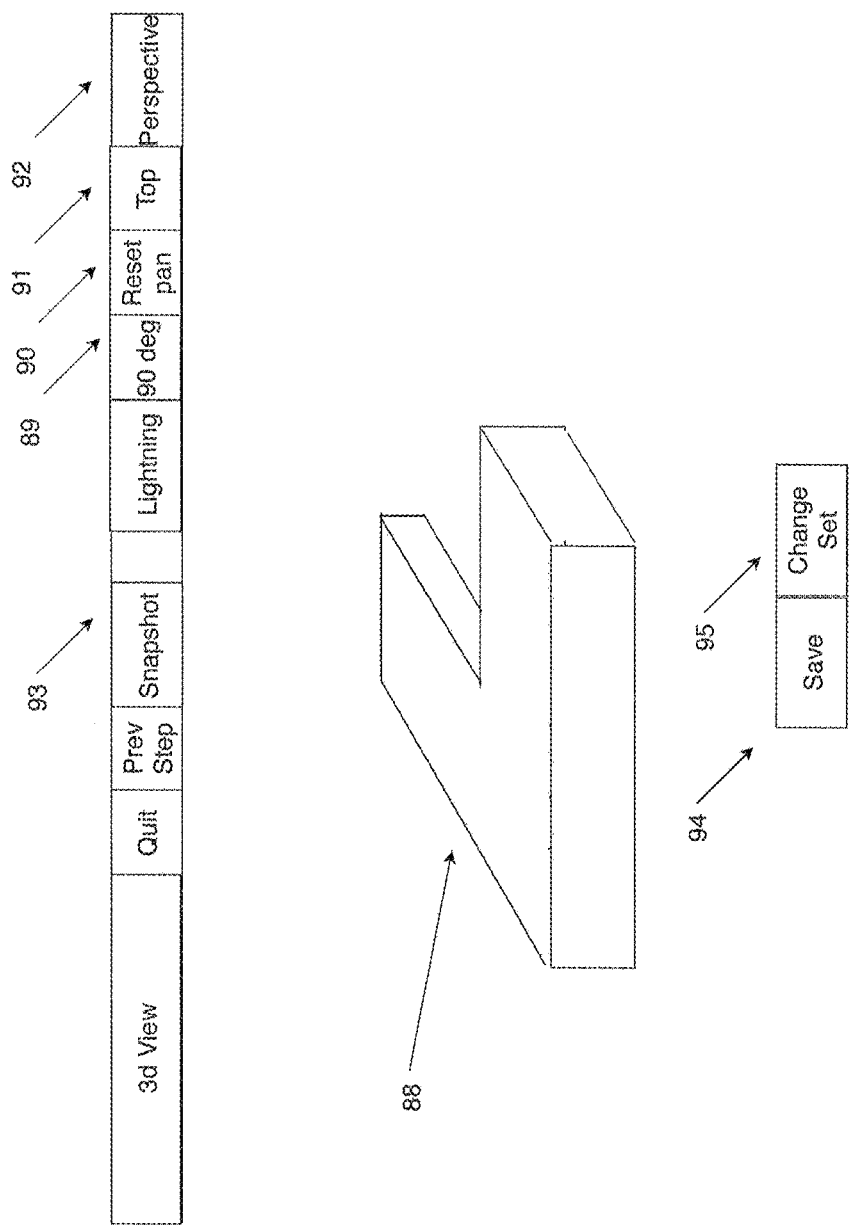
FIG. 23 is an example of the Counterpad graphical user Interface showing the 3d preview of the countertop and it's tools.

Referring to FIG. 23 it shows the last step which is a 3d view of the complete project (Item 88). The user can use multiple camera systems (rotate around by dragging, first person) to move around the scene in any way they like. There are also some navigation tools to ease in the presentation of items. Items 91 and 92 let you see a top view of the project, and a perspective view respectively. Item 90 resets any pan done to the rotating camera. And item 89 rotates the entire drawing 90 degrees, which can be used to raise items drawn on the horizontal axis, for example a Fireplace.

Finally to save all this information, or to compare with any previously created sets on the select materials step (FIG. 19). The user can either click the save button (item 94) or the set button (Item 95) to do any of these actions respectively.

Figure 24:
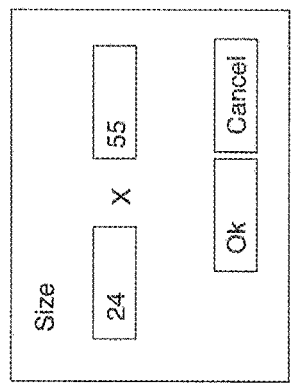
FIG. 24 is an example of the Counterpad graphical user Interface for changing the size of slabs on FIG. 14.
Figure 26:
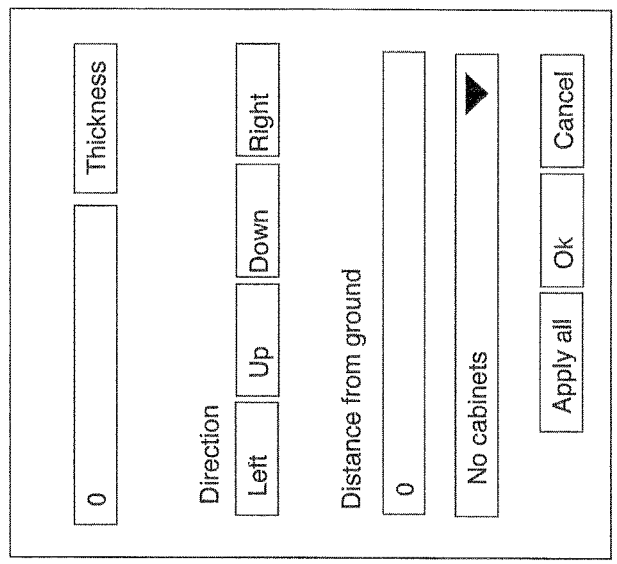
FIG. 26 is an example of the Counterpad graphical user Interface for changing the 3d positioning on FIG. 22.

Referring to FIGS. 24,25 and 26 it shows the UI of the menus used to scale position and move different items described in previous steps.

In FIG. 24. The user can set up the width and height of a shape. In FIG. 25 they can set the distance they want to move and edge, alongside the direction they want to move that edge. In FIG. 26. They can set all the 3d position information, which is. Moving distance for the selected piece direction. Alongside a Thickness button which sets the move value to the thickness of the material. The distance from the ground the piece and finally if they want to use any cabinet for pieces that are off the ground.

Referring now also to FIGS. 25-53E, various illustrations of a system for design visualization using actual product images are illustrated. The present Invention is a distributed computer system designed to manage a virtual warehouse of actual slab images and with them design and create or design visualizations on end-use items using various software programs and a special high resolution display system, called the "Viewing Room." The system is based on three core applications called: Manastone, Eyeslab and Counterpad. Manastone acts as a virtual warehouse of actual slab images by connecting with the inventory system to display the inventory available for selection. Manastone is a centralized application stored on a web server, either on the cloud or a local network.

Figure 27:
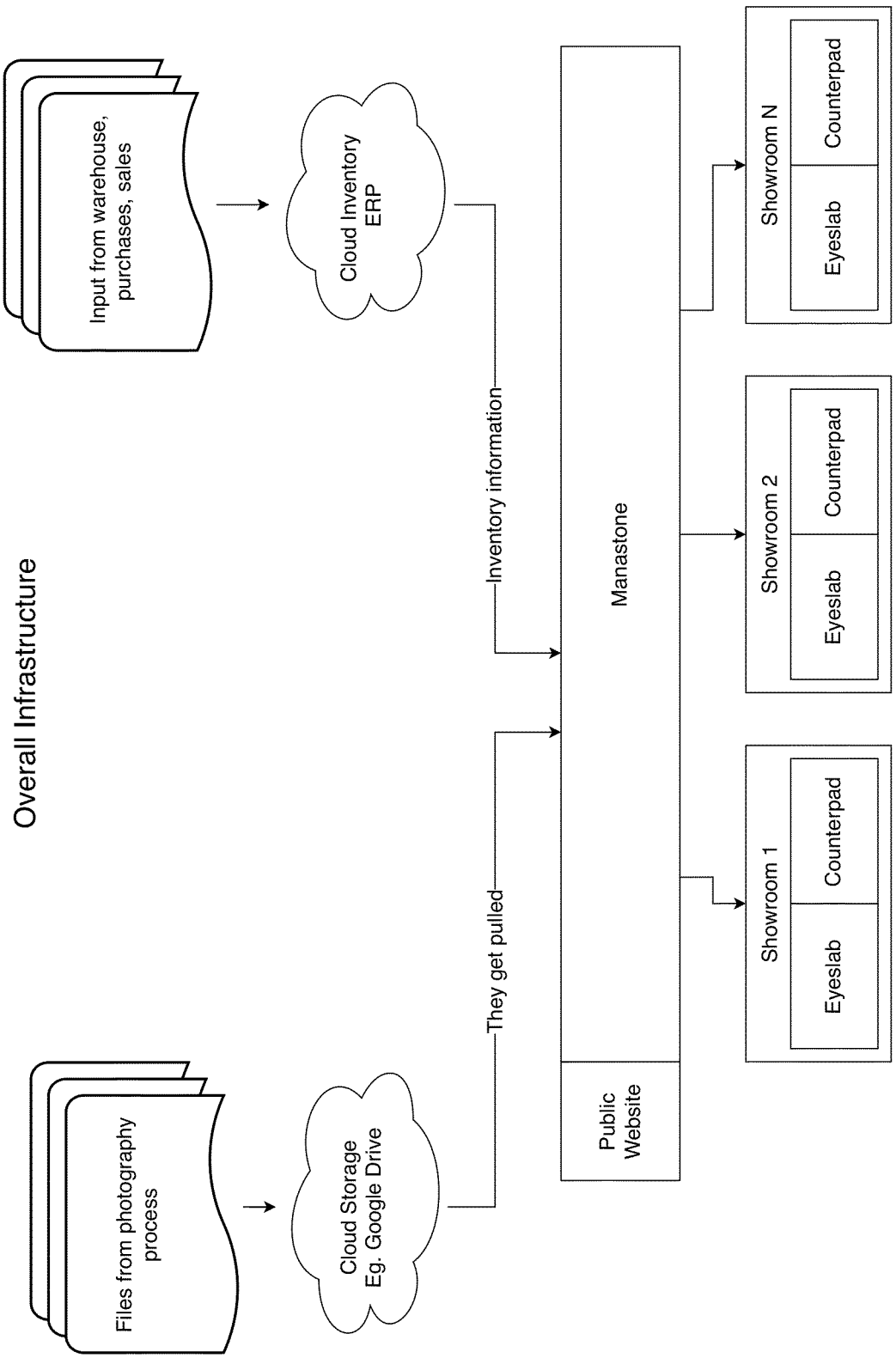
FIG. 27-29 are flowcharts of the system and method.
Figure 28:

EyeSlab serves as an in-store catalog where people can see the slab images from Manastone and make a selection of a specific slab. EyeSlab can work independently from Manastone as long as it has imported data (i.e., the actual slab images) from Manastone. Counterpad is a visualization tool. It uses the selections made from either Manastone or Eyeslab and allows the easy and realistic creation of stone applications using these actual slab photographs. Both Counterpad and Eyeslab reside in the "Viewing Room." FIG. 27 summarizes the infrastructure of the system.

Manastone is the core of the entire system. It is the link between the inventory information, which is the high resolution images all the other systems. Manastone works connected to an external Inventory system, and it feeds in a scheduled basis from a XML-JSON API the entire inventory and its status and stores it on the database. To be compliant with Manastone, the JSON api should have some of the following fields: Name, Bar Code ID, Serial Number, Type of Stone, Thickness, Bundle, Block, Base Color, Origin, Current Location, Image, Length, Width, and/or Available Quantity. Manastone also supports custom created items to allow the application to display permanent, non-variegated materials like man-made quartz that are not dependent an existing inventory.

Manastone also manages the projects that are created either from the website or the Eyeslab+Counterpad duo. A project can either be a selection of slabs or a completed 3D-to-CAD drawing showing how the actual slabs of stone are to be cut. For the second type of project, the following information can be extracted: the list of slabs used, a 3D image of how the product will look, a 2D image of how the product will look (schematic) identifying all the pieces, a set of 2D images that display each of the slabs and how they will be cut to create the design. Project results can be exported either to pdf summary or a pdf summary and a CAD file. On the other side, a CAD file can be imported into the drawing to see the entire model in 3D from the drawing.

Figure 29:
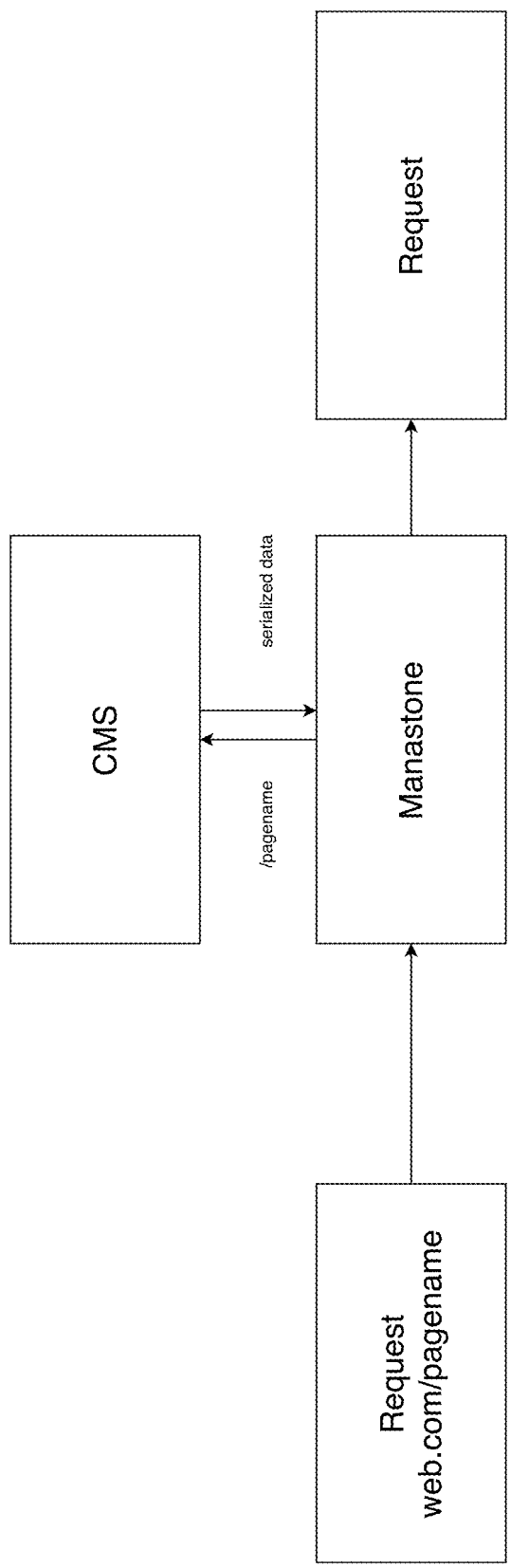
Figure 30:
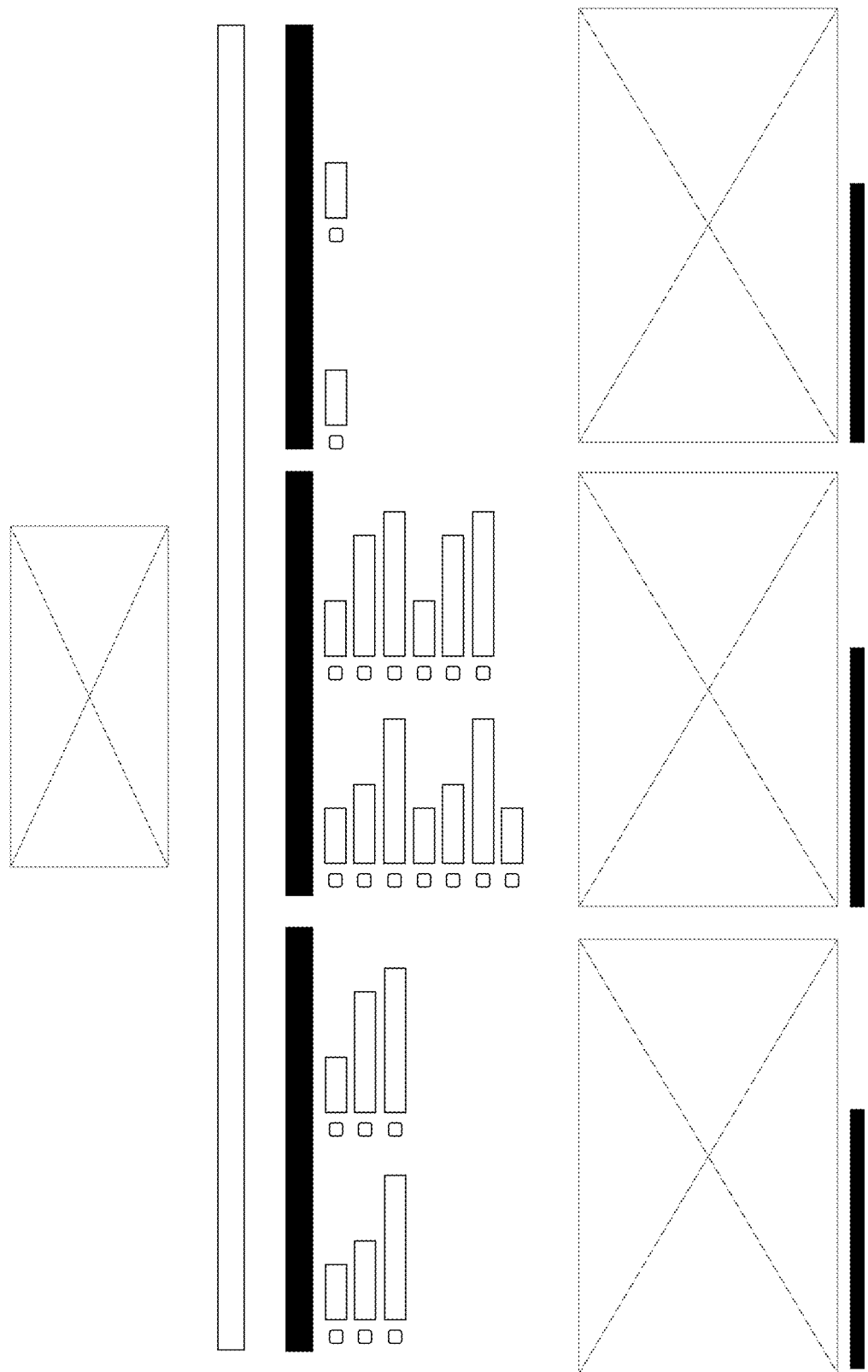
Figure 31:
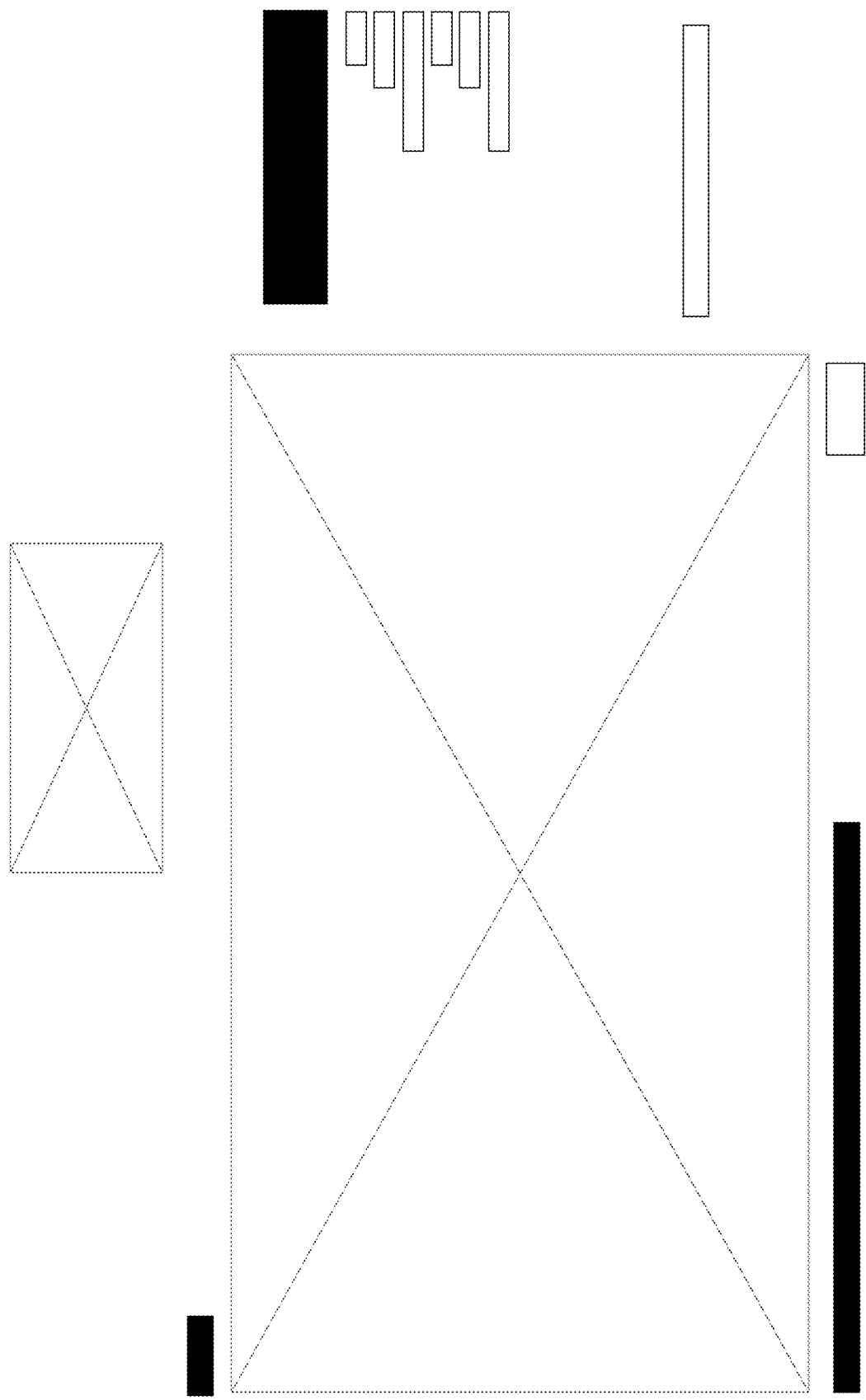

Referring now also to FIG. 29-31. Manastone also manages the public website of the company. It interfaces with any generic CMS by utilizing as an API and passing the user request before the rendering inside manastone. FIG. 29 summarizes the procedure. The procedure is as following, we receive an http request to any page. First it checks if any of the application controllers can reply to it. If those fail, then the CMS controller asks for Information on the CMS. If he gets an appropriate answer he then grabs that information and renders a page. If it fails to grab it will show a 404 error.

Finally the system has a pair of special areas for professionals. The first one is a catalog per Slab. It shows a list of slabs, and then Medium resolution images with all the details. This catalog is only for professionals.

The second one is the project management. There you can create projects, add slabs on the catalog to a certain project, or share a public url with a client so he can access the catalog temporarily.

Figure 32:
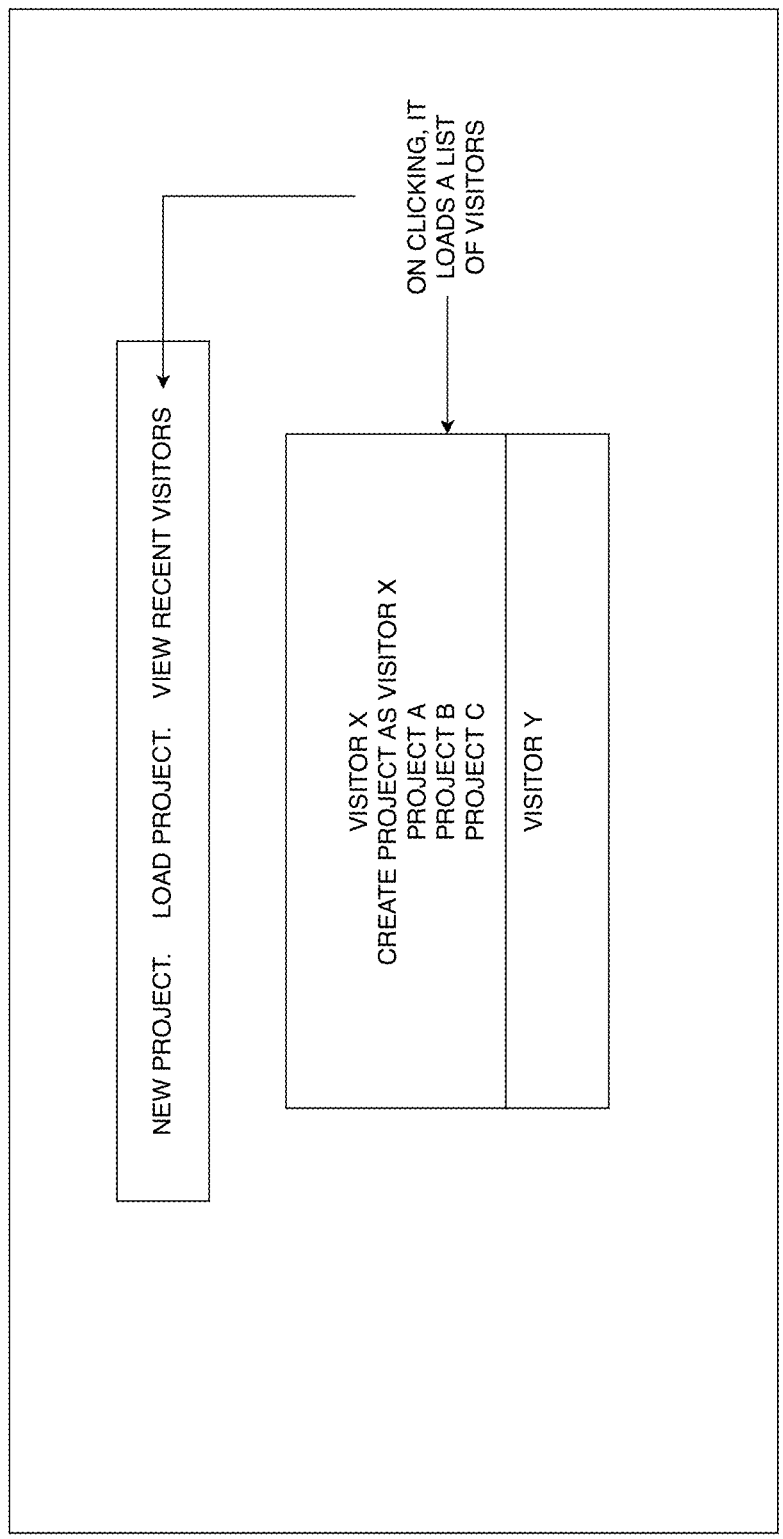

Eyeslab allows users to make actual slab selections displayed on a video wall. The slab application selection approach takes a top-to-bottom philosophy. First, either a new project is created or a prior project is loaded as shown in FIG. 32.

After the project is created or loaded, the user is provided options such as tonal color or type of material or first-letter search so the user can begin narrowing down the search to only the materials he desires as shown in FIG. 33.

Figure 34:
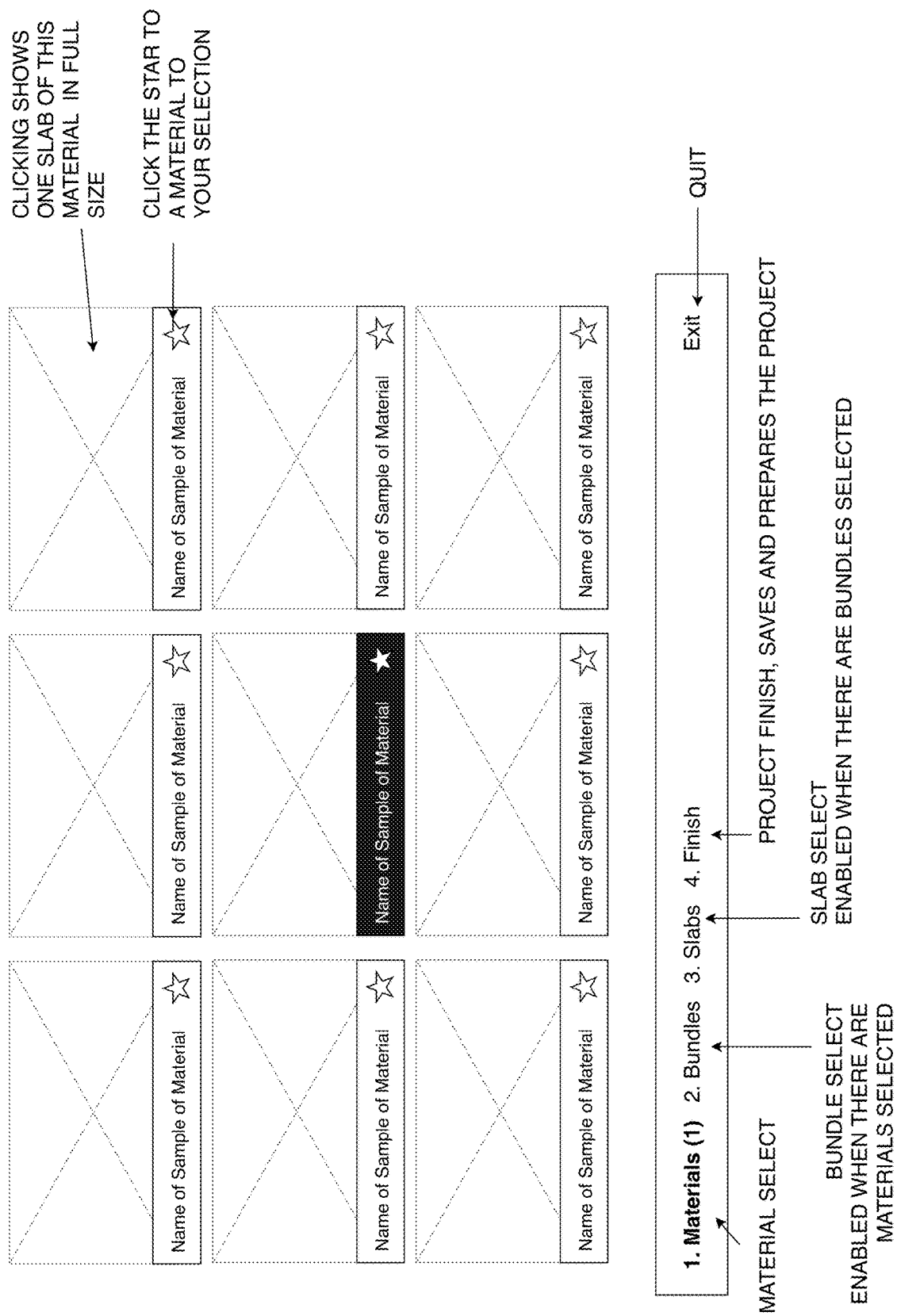
Figure 35:
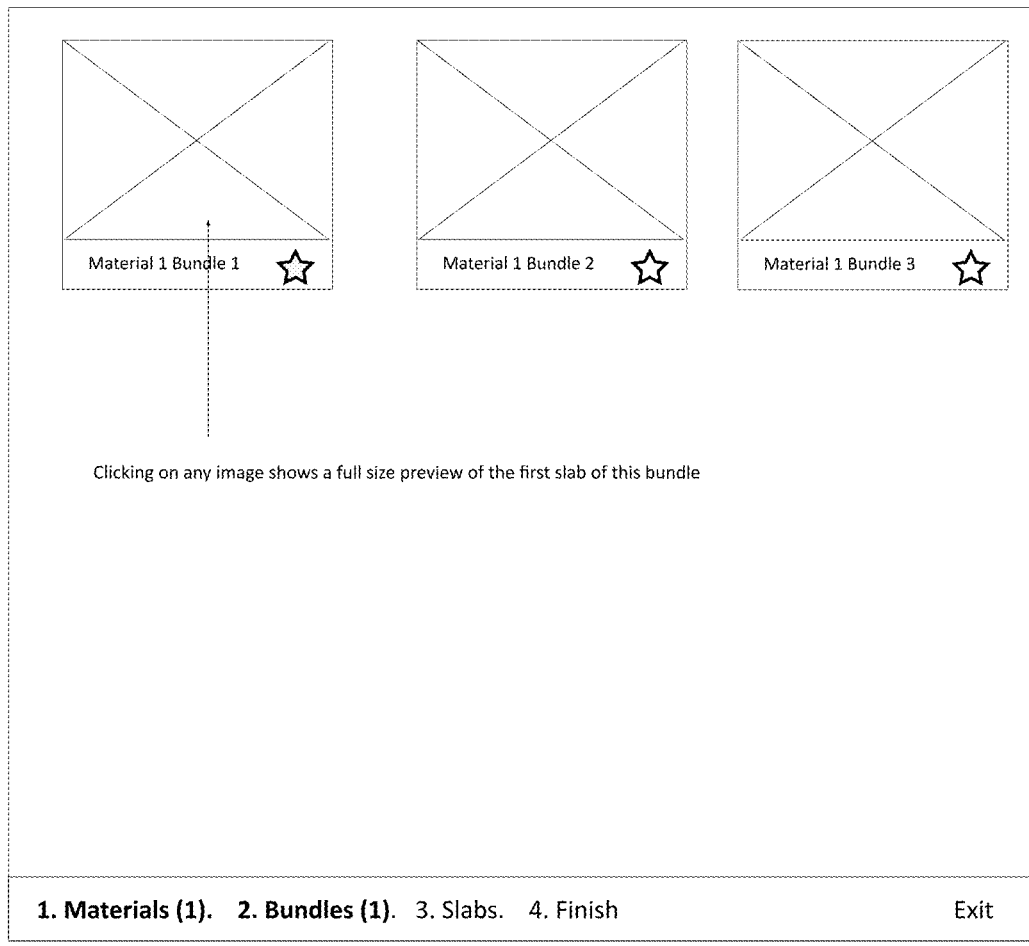

Afterward the search, the user is presented with a list of materials, which are stock pictures taken from one of the slabs. The purpose of the stock photo is just to let the client know generally what the material looks like. If the users desires to see a full-sized slab he can see it by clicking en the image as shown in FIG. 34.

Once the client decides which materials he likes, the list is narrowed down to the actual stone bundles of these materials. The screen below shows the first slab of each bundle, which can be previewed in full size using the viewer.

Figure 36:
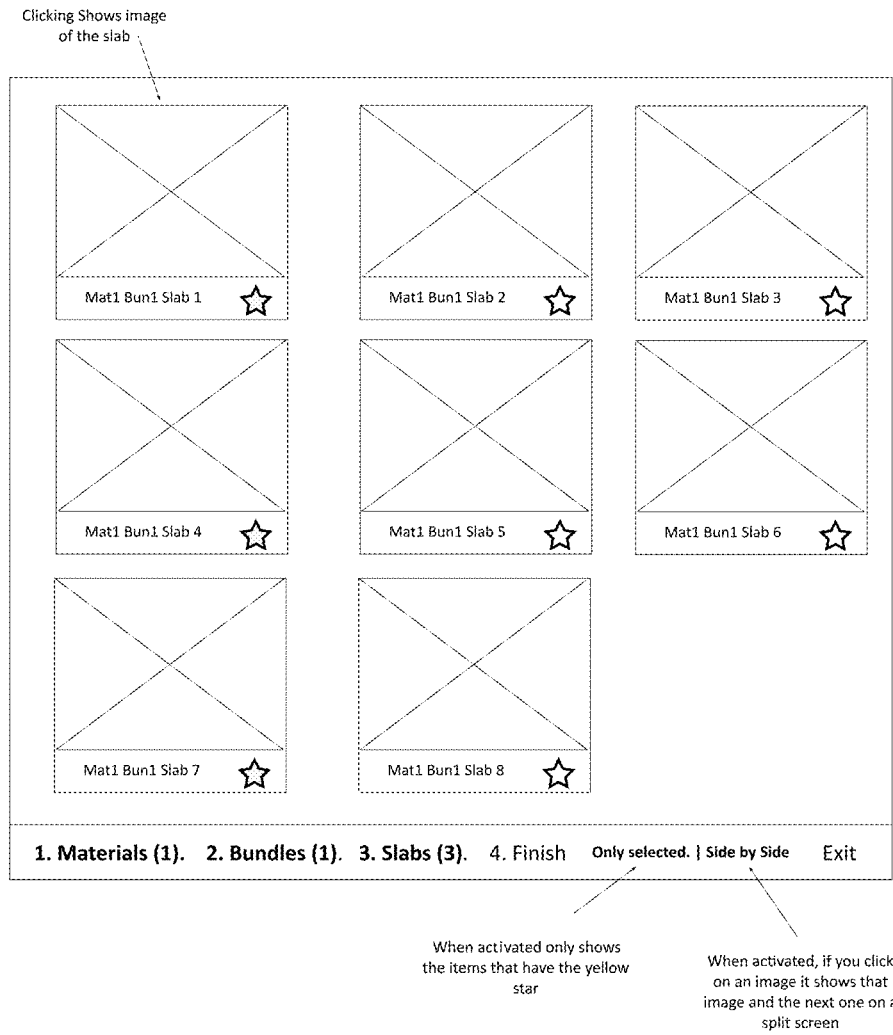
Figure 37:
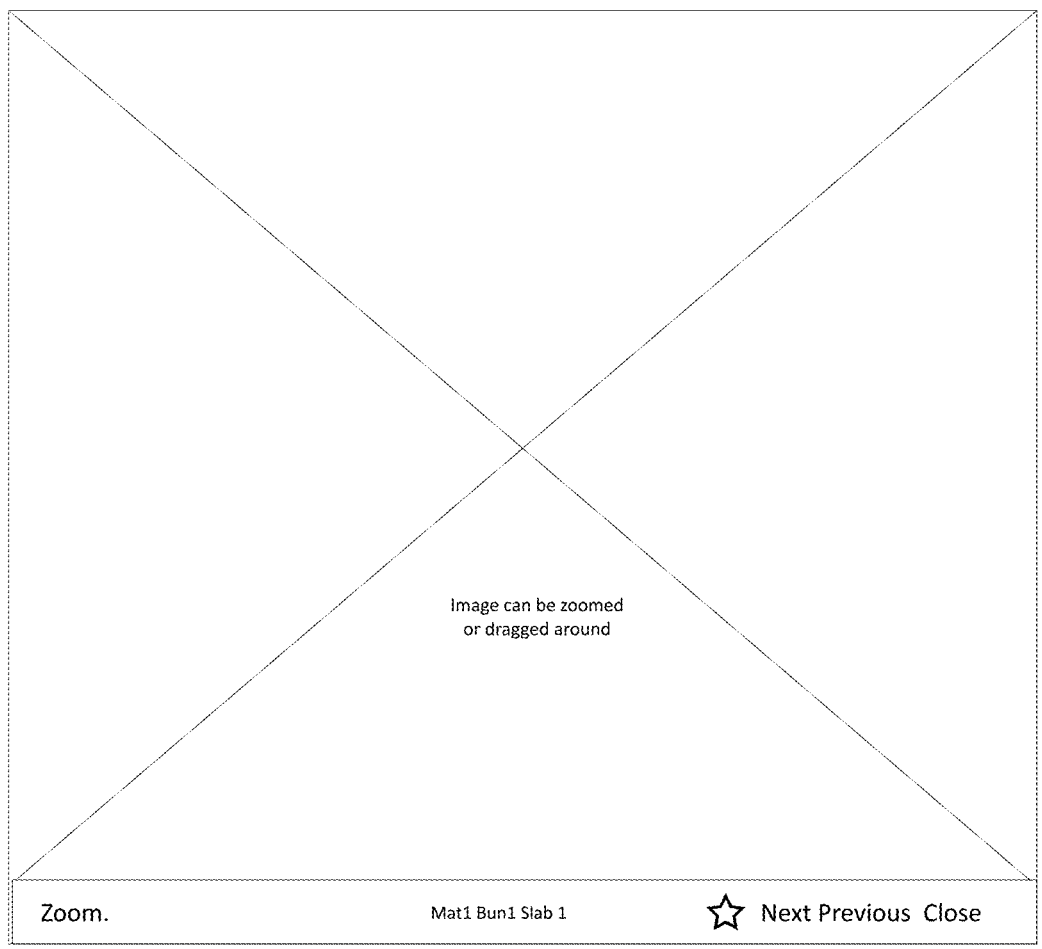
Figure 38:
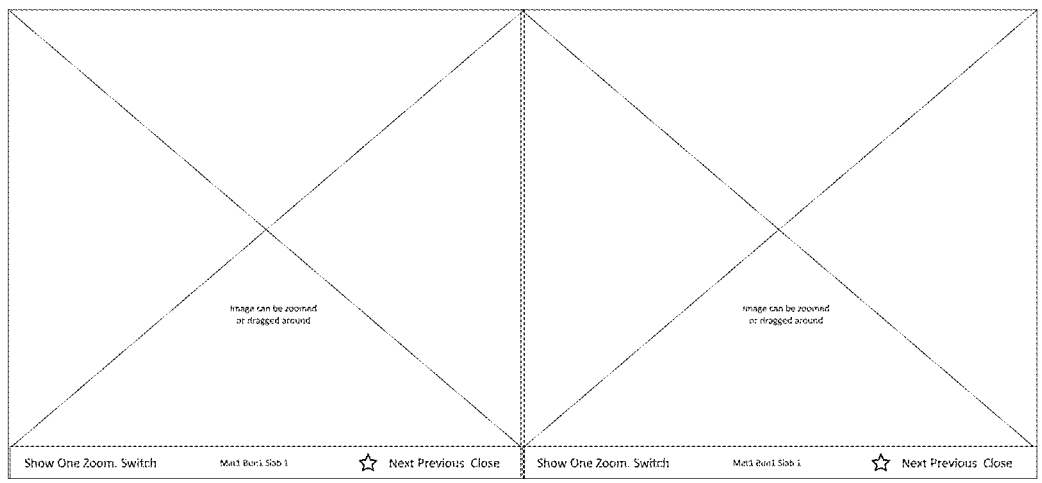
Figure 39:
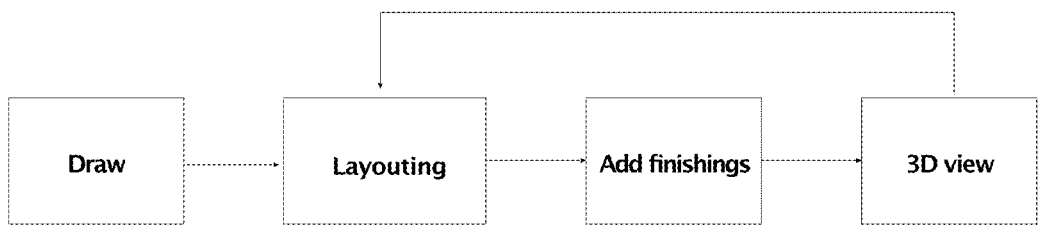
FIG. 39 is a flowchart of the system and method.

Finally, the actual slab selection occurs. As shown in FIG. 36, all the slabs of the bundles selected in the previous step are shown. The user can filter to see only the slabs selected, and he can see a side to side view of those slabs to preview how a stone bookmatch would look or to see how two slabs 'match next to each other.

The system also includes a high resolution slab viewer. Due to the high resolution of the image instead of using a single high resolution image, a tiling system is used, which is similar to what mapping applications use. The main image is split into a set of different sized image tiles, using the Deepzoom format which are then loaded according to the zoom level and position of the photo. There is also a side by side view that lets you view two slabs side by side at the same time. Further, Eyeslab has a scheduled system to download the high resolution Images from Manastone to increase the speed in which the pictures can be loaded quickly for both the slab selection process and Counterpad operation.

Counterpad is the visualization tool, which allows a user to easily draw the client's countertop layout, and then lay that drawing on top of a real stone image and view the result in 3D. The final 3D result can be exported to Manastone to generate a report. Counterpad is separated into four main steps: Drawing, Layout, Finishing and 3D viewing.

Figure 40:
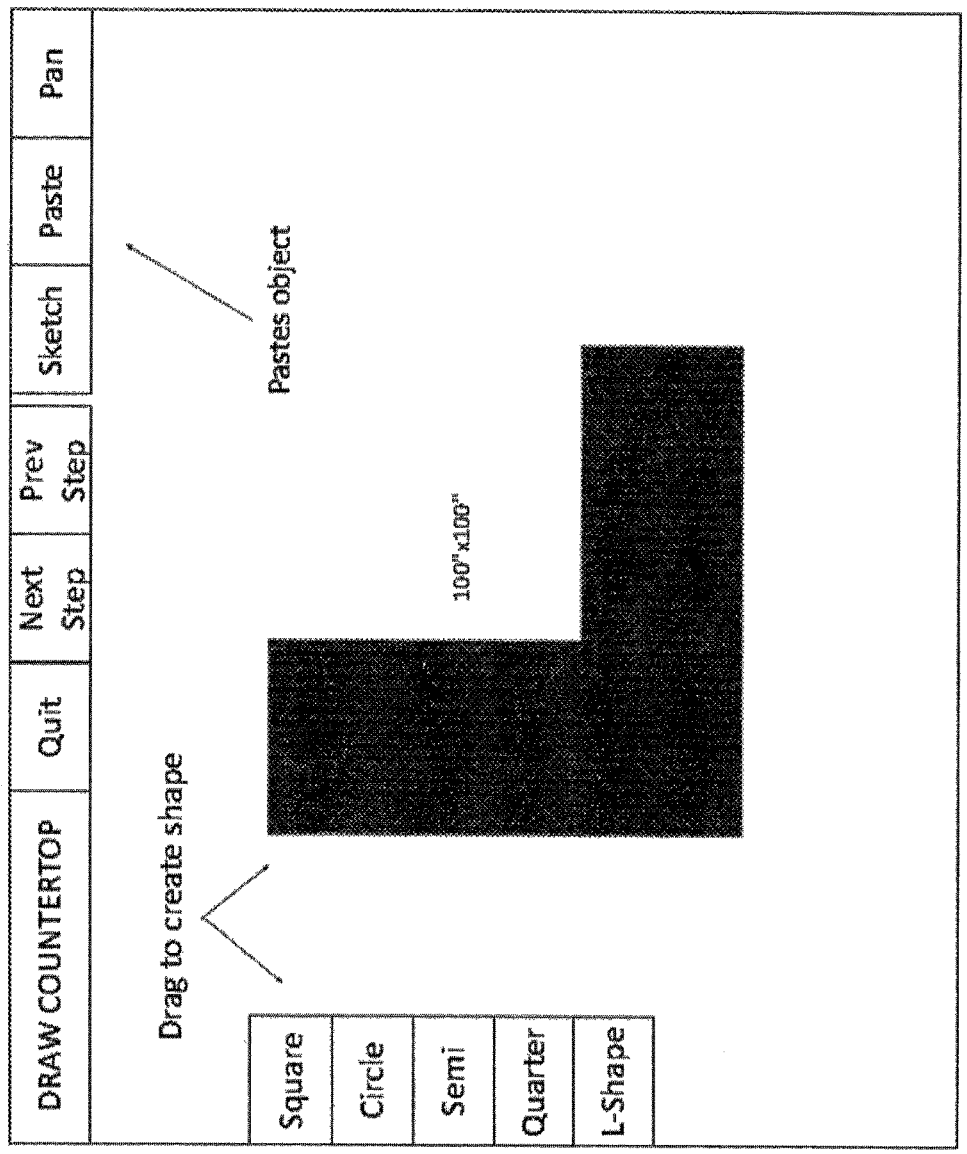
FIG. 40-52 are examples of a graphical user Interface associated with the system and method.
Figure 41:
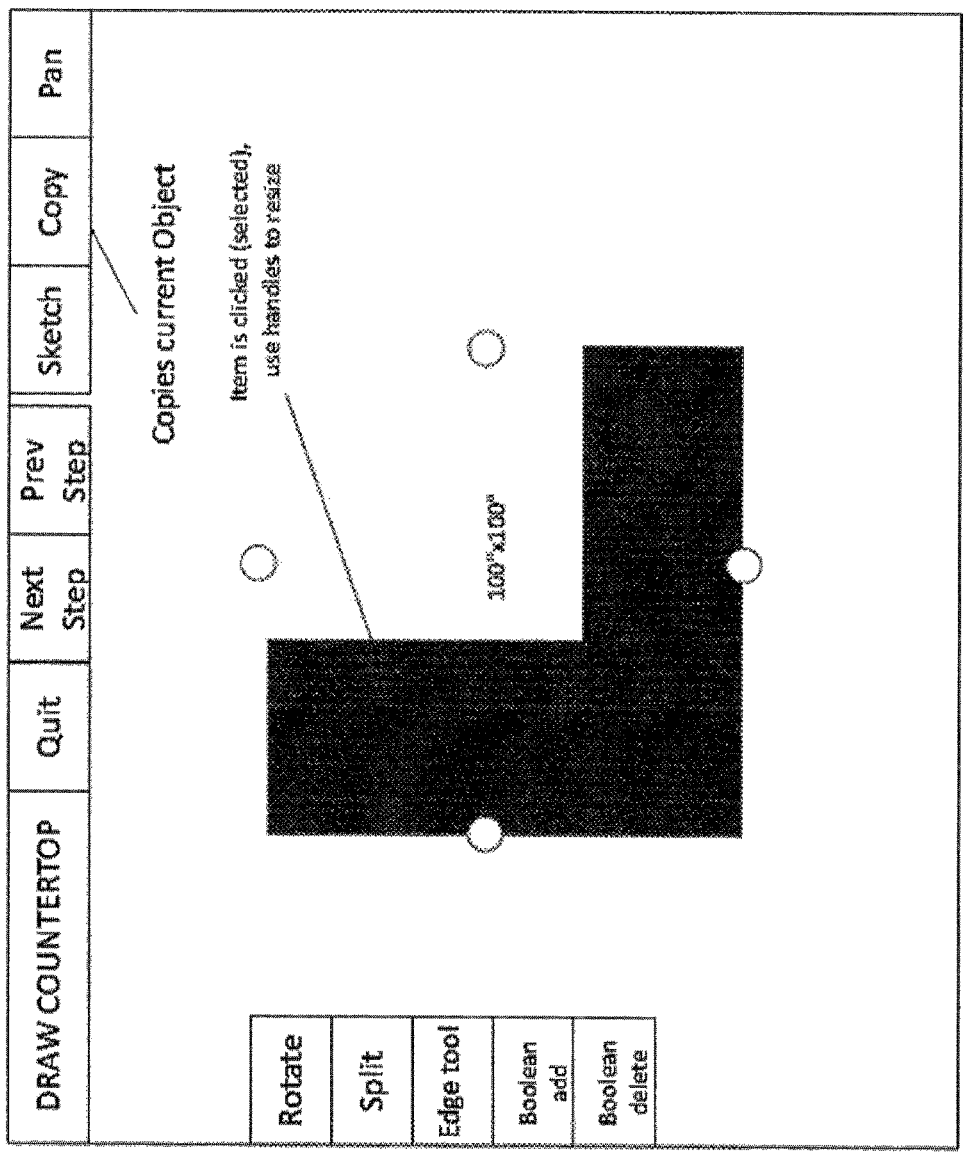
Figure 42:
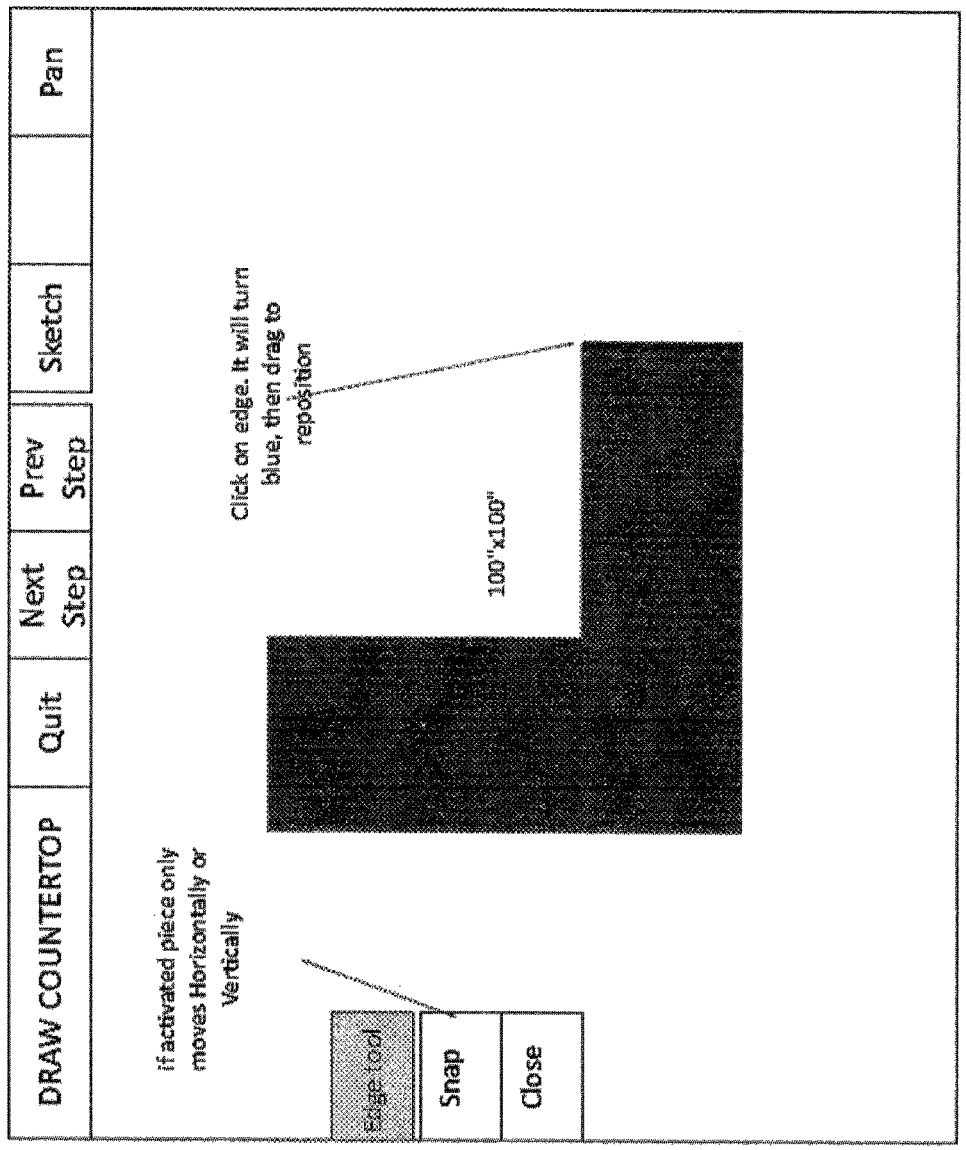
Figure 43:
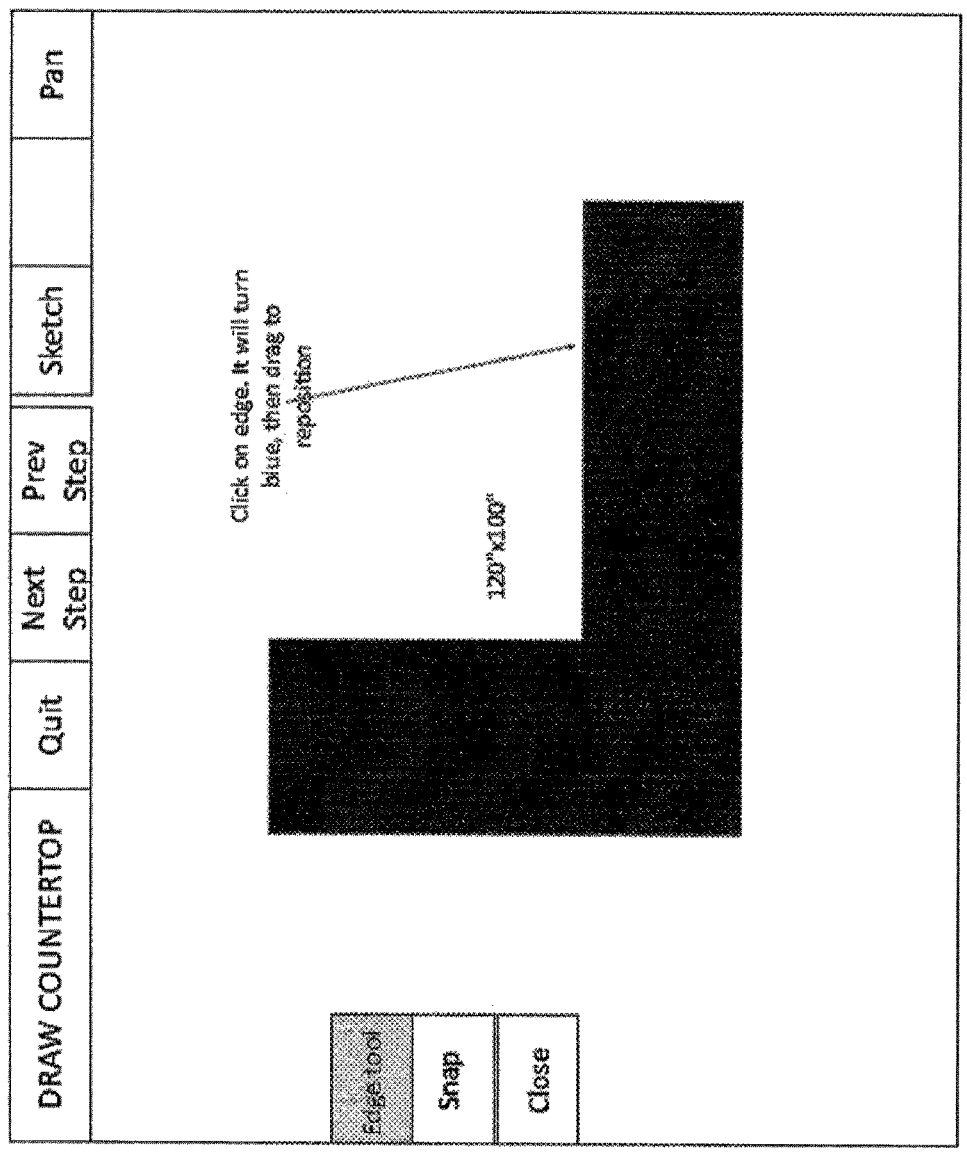
Figure 44:
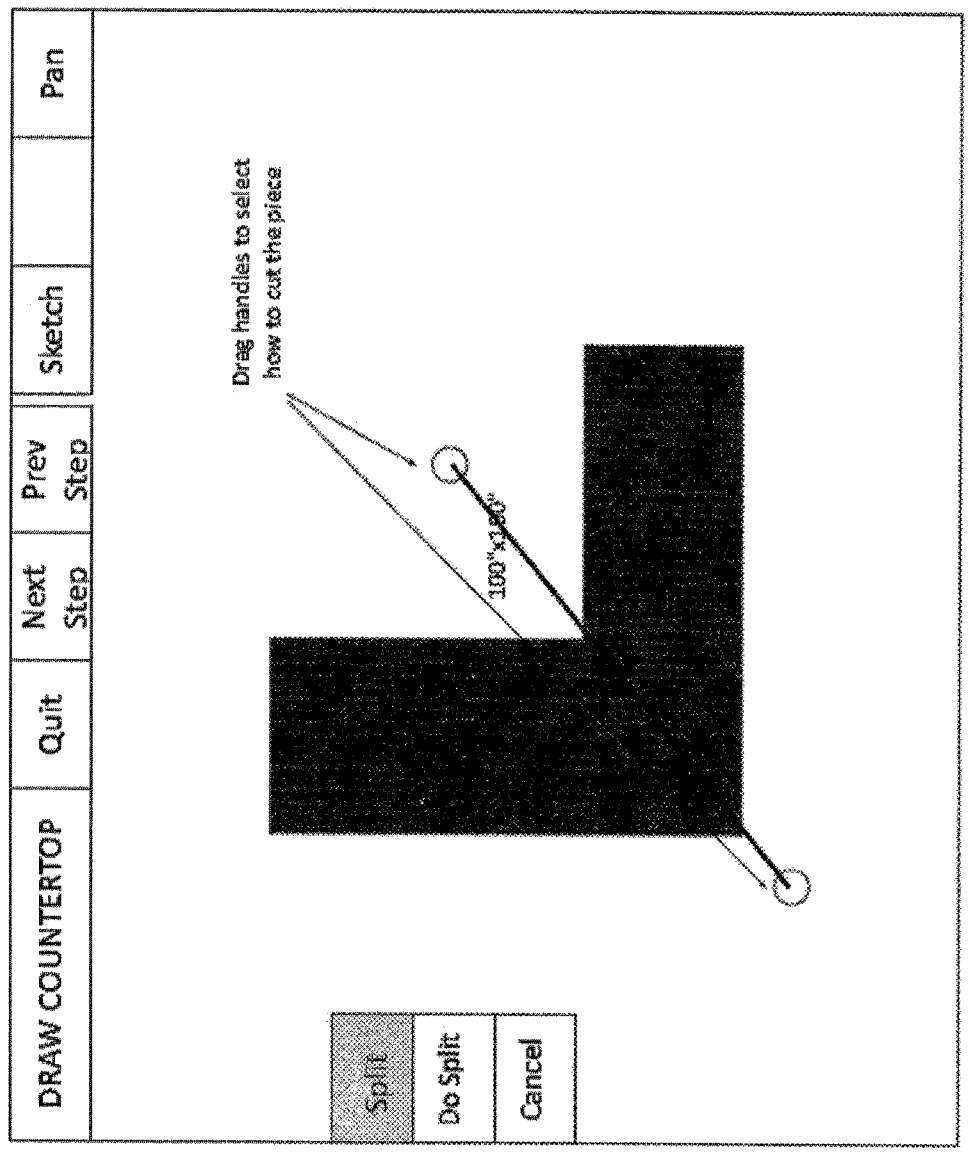
Figure 45:
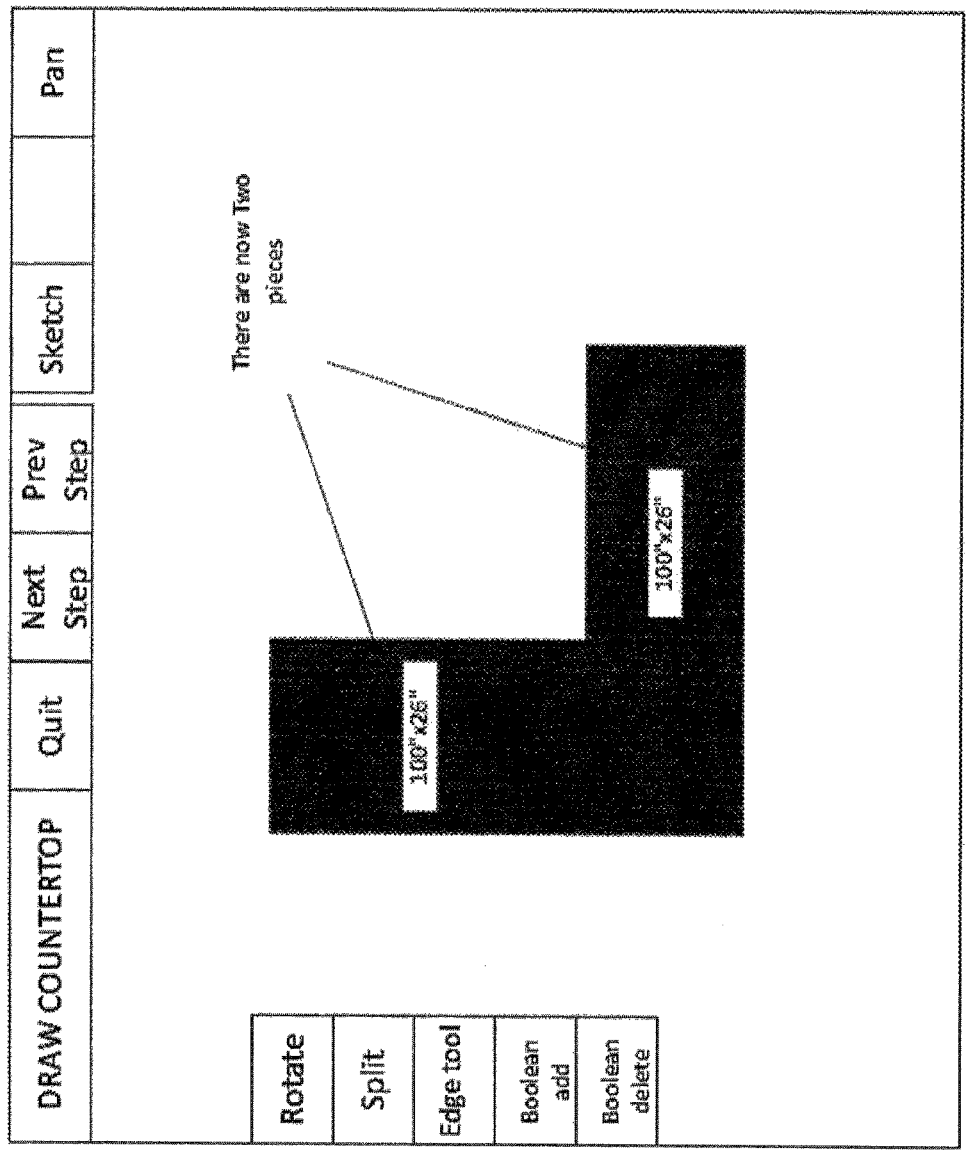
Figure 46:
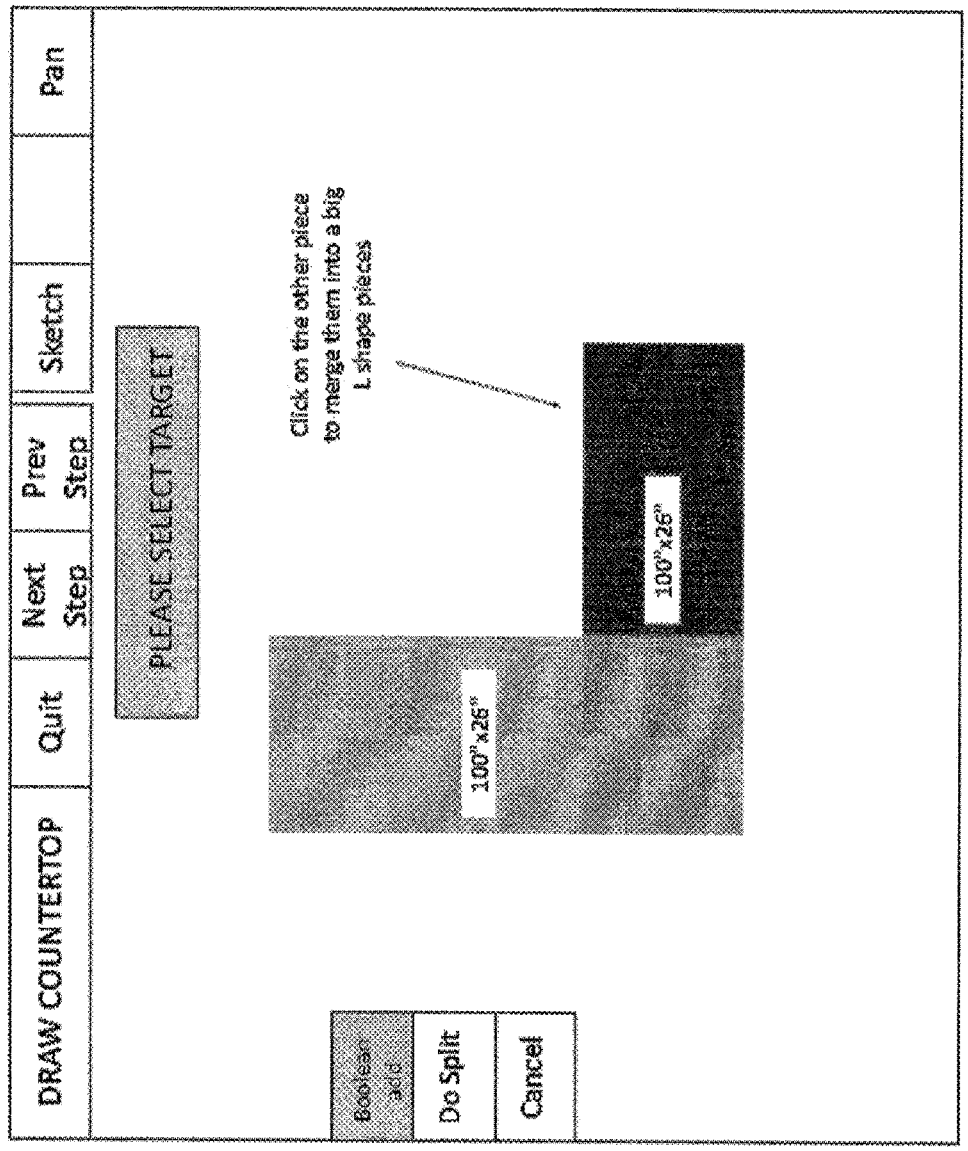

In the drawing step, the client's actual countertops or other selected uses are drawn in 2D. Because it is a two-dimensional working drawing, which will ultimately be shown in 3D, the process is split into three parts or steps: 1) horizontal elements (for example countertops), 2) vertical elements (for example walls or backsplashes), and 3) cutouts (for example sinks). The drawing step is shown in FIG. 40.

Figure 47:
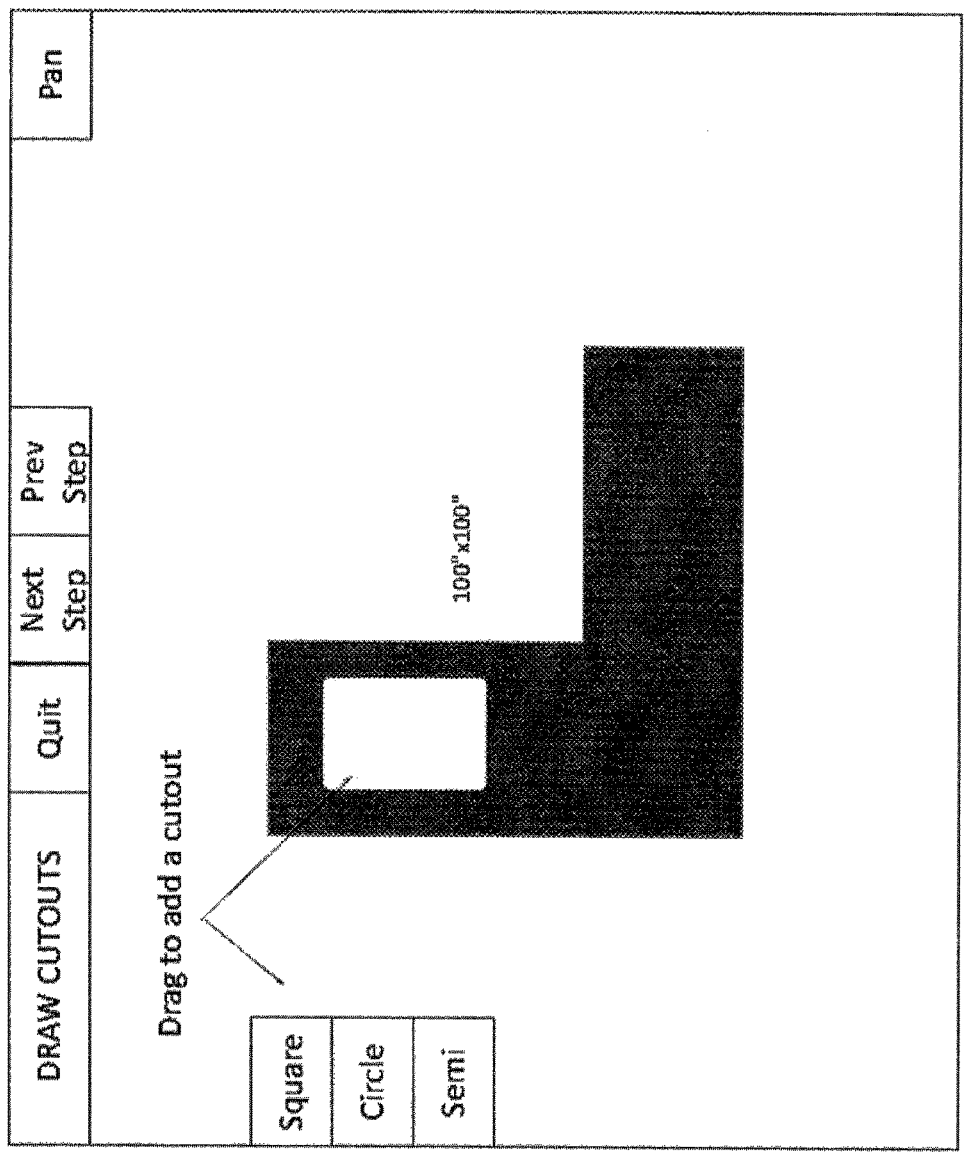

The drawing functionality begins with user dragging a basic piece from the drawing toolbar to the drawing canvas as shown in the figure above. Once the basic piece is on the drawing canvas, the user can select and edit the piece. There are several tools included in Counterpad, which allow the user to edit the piece including the following: 1) Drag Handles to allow the user to drag and scale the piece proportionally to the handle that is selected, 2) Rotate to allow the user to rotate the piece in multiples of a preset degree value, 3) Edge Editing to allow the user to select a single edge and drag it to alter that edge for the entire piece, which is especially useful for example on L-shapes where dragging the handle to rescale proportionally would break one of the sides dimensions by making it bigger or smaller, 4) Splitting to allow the user to position a splitting line segment, which splits the piece in two as if it was cut by someone following the line, 5) Boolean Operations to allow the user to perform basic boolean operations, like merge two pieces, or subtract one piece from another. FIG. 41-46 illustrate editing tools available to the user in the Drawing step of Counterpad, Additionally, there are tools that allow the user to draw cutouts, which is accomplished by allowing the user to draw simple shapes on top of the countertops and mark that position as a cutout element (i.e., making a hole in the stone in that position for like a sink). Drawing cutouts is shown in FIG. 47.

Figure 48:
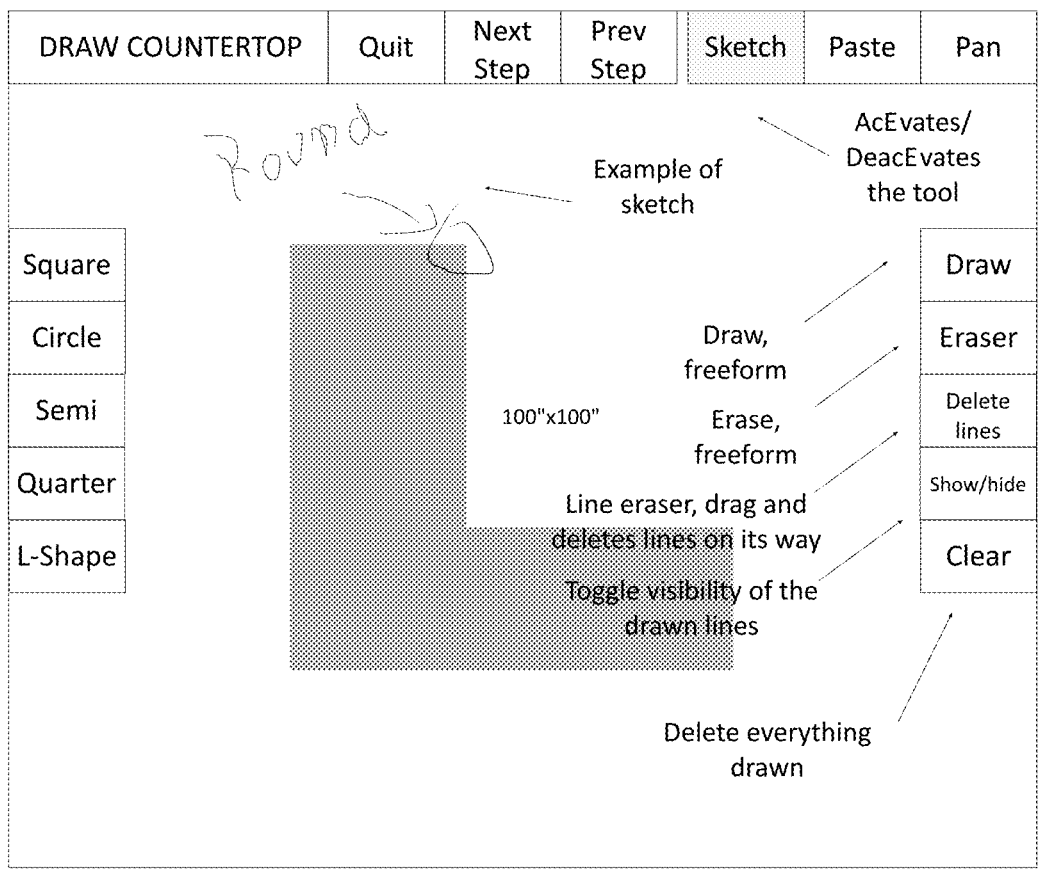
Figure 49:
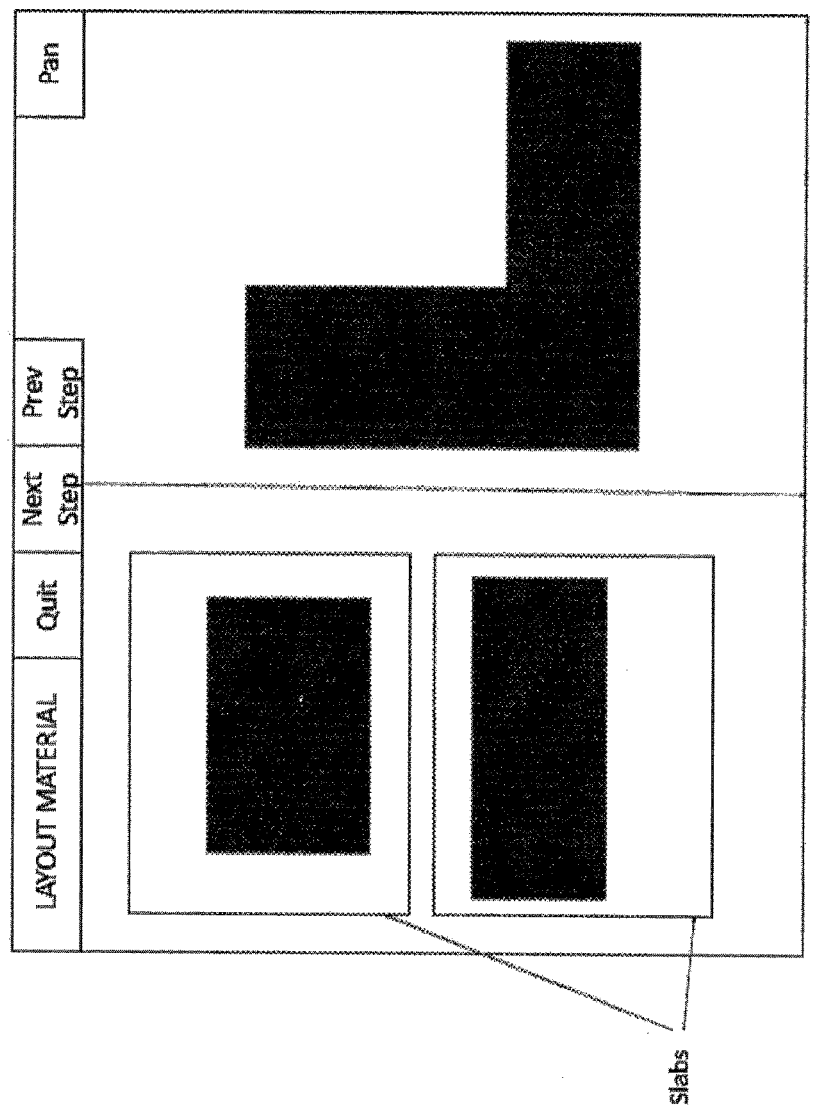

Another tool available to the user is the Sketch/Pencil tool, which allows the user to add notes on top of the drawing or sketch without altering the drawings contents. The Sketch/Pencil tool is shown in FIG. 48.

Once the Drawing step is completed, the user next performs the Layout step. The Layout step is split in two parts: 1) material selection and 2) layout of the materials. Material selection involves the user selecting the materials and slabs desired for the project that were chosen earlier in Eyeslab. If the user wants to add more choices to their material selection, the material list can be reloaded and additional materials selected. The layout of the materials portion involves positioning the selected materials by dragging them on top of the drawing, which results in a contemporaneous preview of the finished result. Additionally at this step, the user can also split the stone in multiple pieces, which is done in the same way as is done in the drawing step. The Layout step is shown in the FIG. 49.

Figure 50:
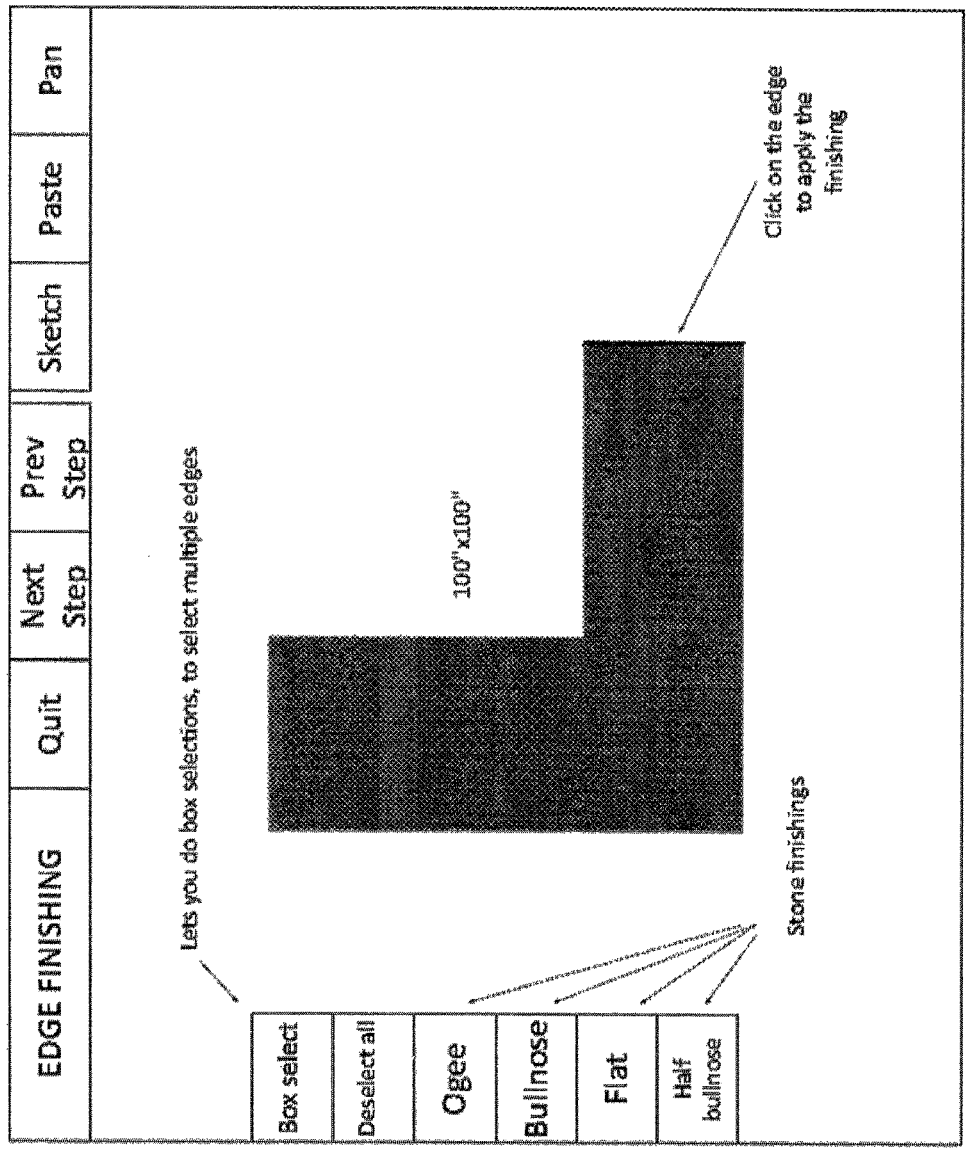
Figure 51:
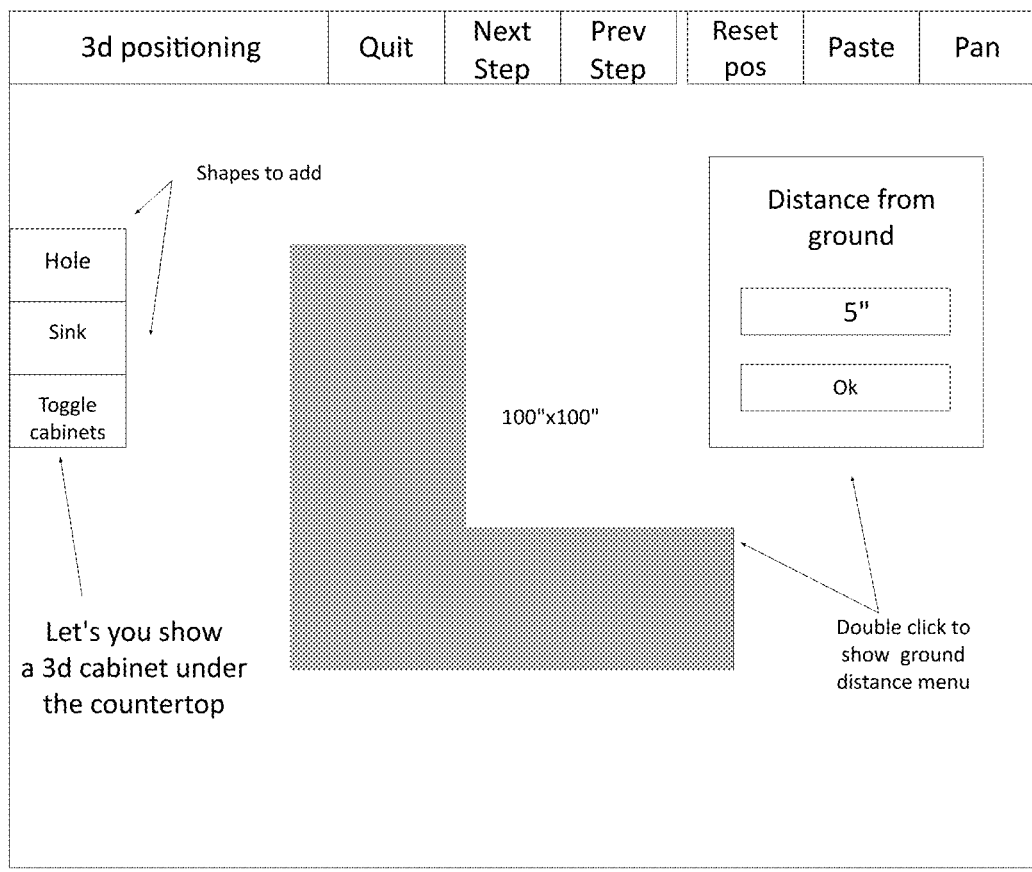

After the Layout step is completed, the user performs the Finishing step, which involves edge selection and 3D positioning. Edge selection allows the user to add finishings to the edges of the stone such as Ogee or Full Bullnose. Edge finishing is shown in FIG. 50.

3D positioning allows the user to stack certain elements on top of each other because the drawing was completed in a 2D environment. For example, if the user draws a bathroom floor and then a shelf on the wall on top of that floor, the 3D positioning allows the user to stack those items together and then add the height difference between the two layers. It also allows the user to add other items, like holes and sinks. The 3D position step in shown in FIG. 51.

Figure 52:
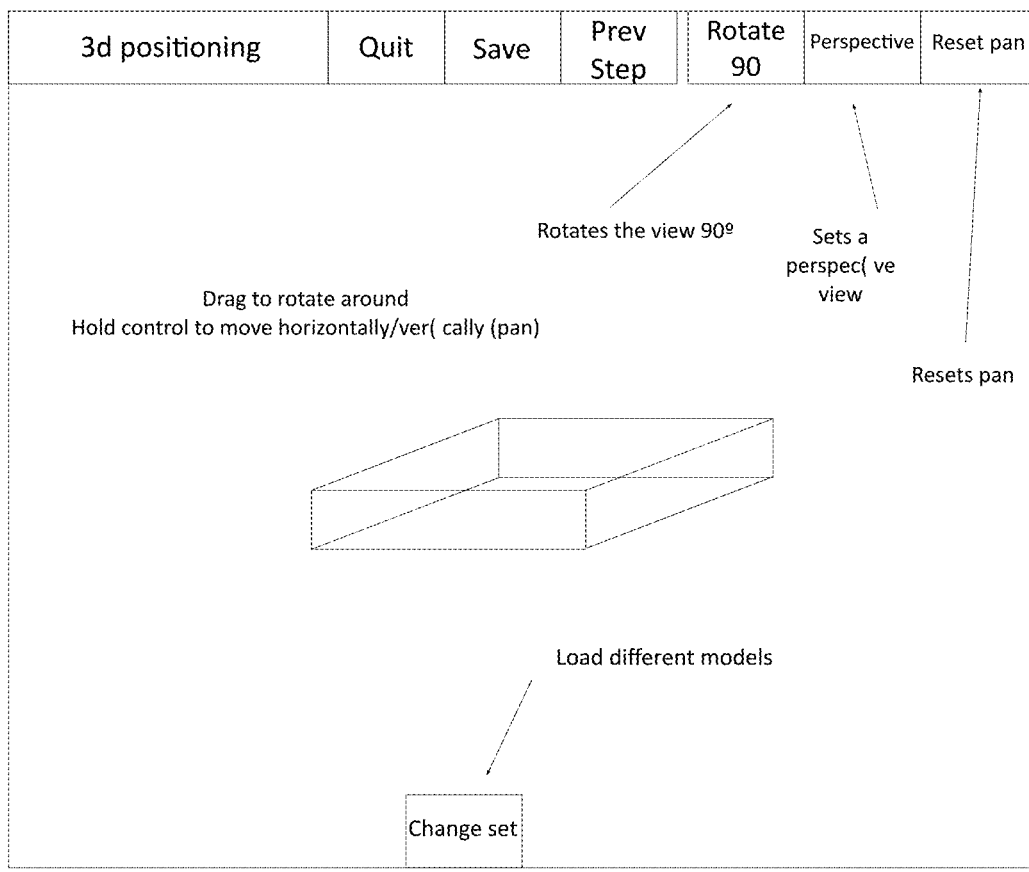
Figure 53A:
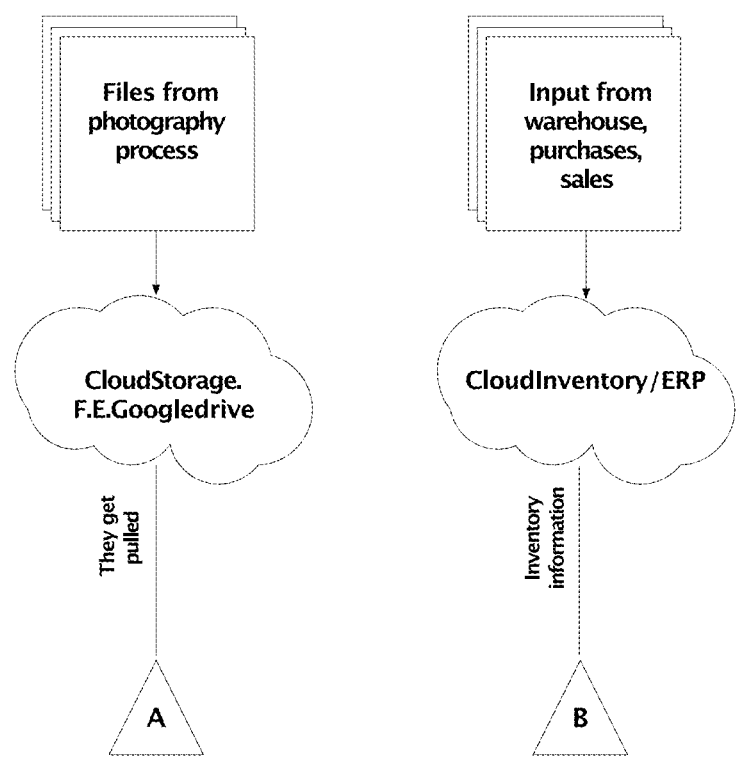
FIG. 53A-53E are flowcharts of the system and method.
Figure 53B:
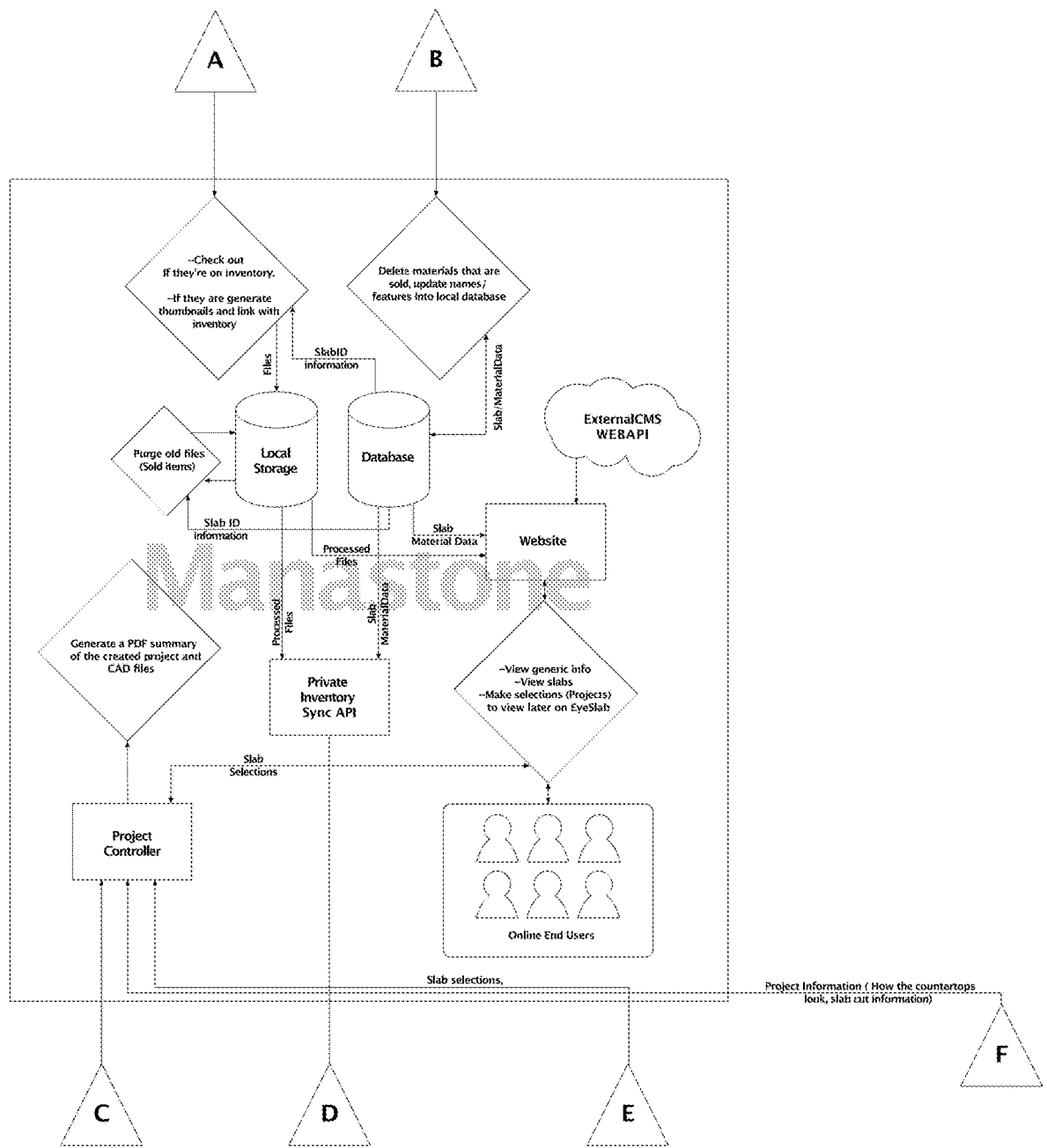
Figure 53C:
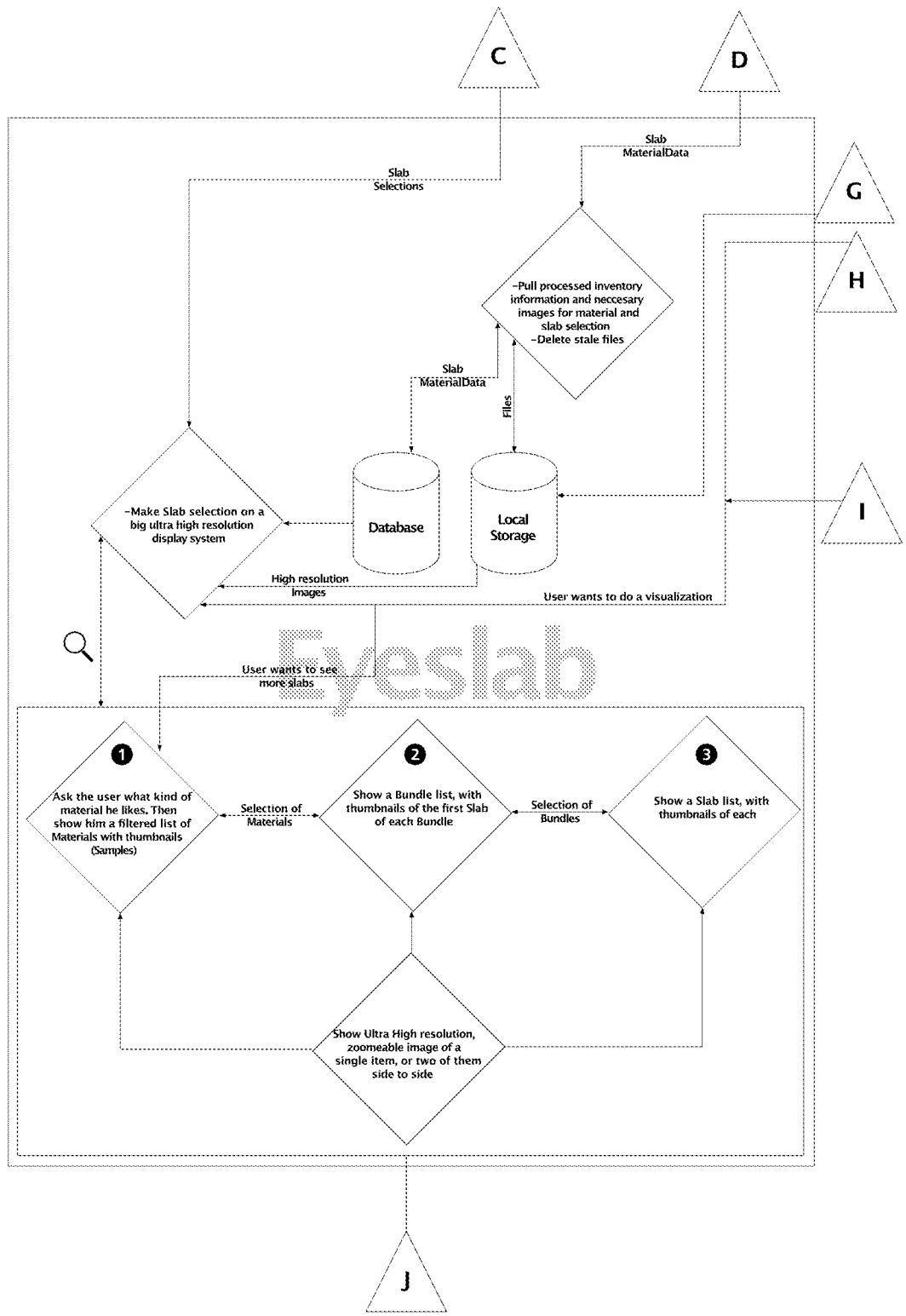
Figure 53D:
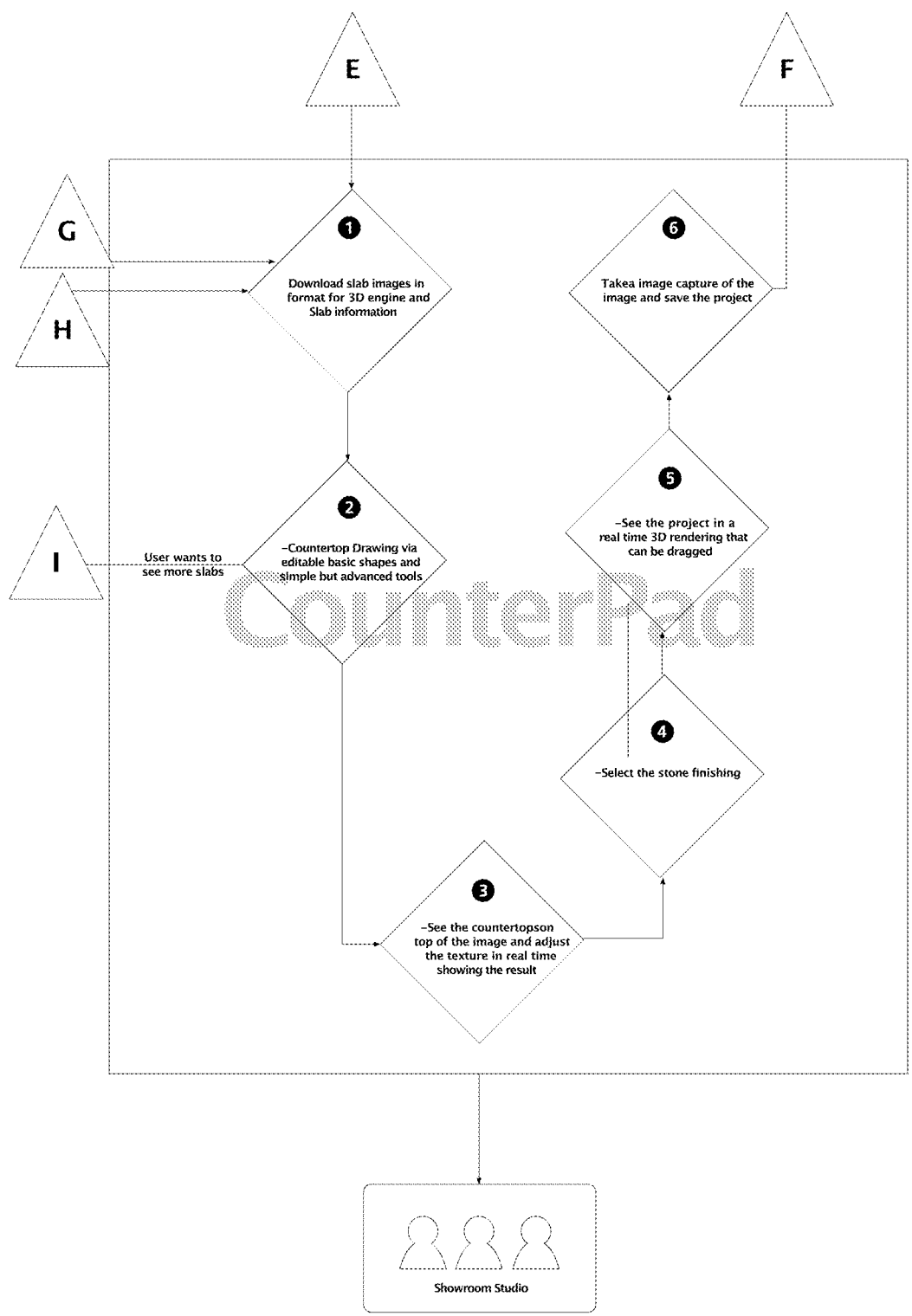
Figure 53E:
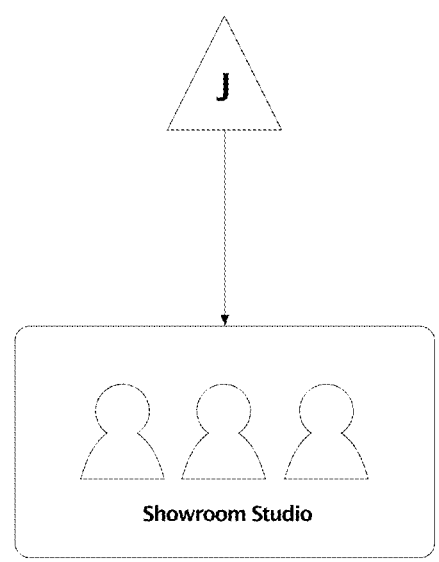

After the Finishing step is the 3D Viewing step, which allows the user to see a 3D model representation of what was built during the previous step. The 3D viewing step allows the user to move, rotate and zoom in and out on the model to see the details and how the selected materials appear on the different surfaces. There is also a secondary camera mode called Third Person viewer that allows the user to move as if flying over the drawing, reminiscent to third person videogames. The 3D Viewing step is shown in FIG. 52.

Once the user is satisfied with the final outcome, a snapshot of the project is taken and the project is saved. The saving process includes storing snapshots of every slab and how the slabs are cut, an image of the 3D preview, and a 2D preview naming all the pieces to allow identification on the slab pictures. All of this saved information is sent directly to Manastone, which generates the PDFs to allow transmission of the information directly to the user and/or the client.

FIGS. 53A-53E summarizes the three applications used in the distributed computer system designed to manage a virtual warehouse of actual slab images and with them design and create or design visualizations on end-use items.

The system is based on 3 core applications that are installed in different locations. These are, Manastone, Eyeslab and Counterpad.

Manastone: connects with an ERP/Inventory system to grab the inventory, acts as a virtual warehouse, works as front website with an online catalog and generates the output of the application (CAD, documental summaries for the end client).

Manastone is a centralized application stored on a web server, either on the cloud or a local network.

EyeSlab: Serves two functions. First, to provide the best user experience and since the pictures are very high resolution, it acts as a cache to minimize the load of the images as much as possible. Second it works connected to the High resolution system as an in-store catalog where people can see those slab images and make a selection.

EyeSlab alongside Counterpad sit on the "Viewing Room." EyeSlab can work independently as long as it has imported data from Manastone. Counterpad: Is a visualization tool. It grabs the selections made from either Manastone or Eyeslab and allows the easy and realistic creation of stone applications using these materials.

Counterpad alongside Eyeslab sit on the "Viewing Room." Counterpad is dependent on having access to either Eyeslab or Counterpad to function correctly.

The viewing room is a special room accommodated with multiple comfy chairs and a 'working table' with an 3×3 Array of Full-HD displays as the main component. Either Planar models LX46HDU or MX46HDX with a total resolution of 5760×3240 pixels.

The screens are connected to a Server/Workstation on a Windows/Linux PC that stores and drives the Eyeslab and Counterpad applications at said screen resolution.

Furthermore, the System also further comprises a projector for displaying images of the actual slabs in the user's room. For example, a projector can be temporarily placed above the install location to display actual slab images in the location to be installed. This allows the user to see full scale renditions and locate various imperfections relative to cutouts and incorporate actual lighting from the install location.

It is apparent that a system with significant advantages has been described and illustrated. The particular embodiments disclosed above are illustrative only, as the embodiments may be modified and practiced in different but equivalent manners apparent to those skilled in the art having the benefit of the teachings herein. It is therefore evident that the particular embodiments disclosed above may be altered or modified, and all such variations are considered within the scope and spirit of the application. Accordingly, the protection sought herein is as set forth in the description. Although the present embodiments are shown above, they are not limited to just these embodiments, but are amenable to various changes and modifications without departing from the spirit thereof.

What is claimed is:

1. A method carried out by a programmed computer for assisting a user with planning an installation comprised of two or more stone pieces cut from one or more slabs of stone, the method comprising:
    generating an interactive graphical user interface on a display in communication with the computer, the graphical user interface comprising a drawing canvas for displaying a visual representation of an installation, the installation comprising one or more pieces of material cut from one or more slabs of the material, and the visual representation comprising a plurality of shapes, each shape representing a piece of material in the installation; wherein each of the plurality of shapes each has a relative position and size that corresponds to a relative position and size of the two or more pieces of material in the installation;
    generating in the graphical user interface a layout superimposed on a photographic image of each of the one or more slabs of material, the layout comprising each of the plurality of shapes arranged to indicate where each of the pieces is to be cut from the slab of material;
    for each of the plurality of shapes in the visual representation, applying to the shape a portion of the photographic image delineated by a corresponding shape in the layout; and
    in response to user input changing the relative position or size of one of the plurality shapes in either the visual representation of the installation or the layout automatically updating the position or size of the corresponding shape in the other of the drawing canvas and layout.

2. The method of claim 1, further comprising generating information for cutting each of the one or more slabs.

3. The method of claim 1, further comprising displaying to the user a visual representation of an inventory containing a plurality of slabs of material and photographic images for each of the plurality of slabs of material; wherein the one or more slabs of material comprise slabs of material picked by the user from the displayed inventory.

4. The method of claim 3, further comprising displaying to the user a graphical representation of a plurality of types of stone material and, in response to a user input selecting one of the plurality of types of stone material displaying bundles of slabs of stone from the inventory of the selected type of stone material.

5. The method of claim 3, further comprising generating in the graphical user interface a list of types of material for which there are slabs in inventory and receiving, in response, a user selection of one or more types of material.

6. The method of claim 1, further comprising receiving a user input received through the graphical user interface indicating a change to the visual representation of the installation and, in response thereto, updating the layout and the portions of the photographic image delineated by the layout and applied in the shapes in the drawing canvas.

7. The method of claim 1, further comprising receiving user input through the graphical user interface indicating for at least one edge of at least one of the plurality of shapes in the drawing canvas an edge treatment; and, in response to the indication of edge treatment, updating the layout to delineate material from which to construct the edge treatment.

8. The method of claim 1, further comprising receiving user input through the graphical user interface to a cutout to one of the plurality of shapes and, in response, updating the layout to illustrate the cutout.

9. The method of claim 1, wherein the graphical user interface displays a library of predefined shapes for selection by a user, from which to create the visual representation of the installation.

10. A method for planning cutting of two or more stone pieces from one or more slabs of stone for an installation, the method comprising:
    storing in a database a photographic image for each stone slab an inventory comprising a plurality of stone slabs;
    displaying on a display in communication with a programmed computer one or more of the photographic images;
    receiving with the programmed computer in response to displaying one or more of the photographic images user input indicating selection of one of more of stone slabs from the plurality of stone slabs;
    retrieving from the database the photographic image of each of the one or more slabs;
    generating a visual representation of an installation of pieces of material cut from the one or more slabs, wherein each of the pieces of material has a shape with a position and size;
    displaying on the display the visual representation of the installation and a layout superimposed on the one or more of the photographic images, wherein the layout comprises the one or more shapes associated with each of the pieces of material and the shapes are arranged to indicate where each of the pieces of material is to be cut from the one or more of the stone slabs, wherein changing a position or size of one or more shapes on either the visual representation or the layout automatically updating the position or size of the corresponding shape in the other of the visual representation and layout; and
    generating instructions for cutting each of the one or more slabs to create the stone pieces.

11. The method of claim 10, further comprising displaying to the user a visual representation of an inventory containing a plurality of slabs of material and photographic images for each of the plurality of slabs of material; wherein the one or more slabs of material comprise slabs of material picked by the user from the displayed inventory.

12. The method of claim 11, further comprising displaying to the user a graphical representation of a plurality of types of stone material and, in response to a user input selecting one of the plurality of types of stone material displaying bundles of slabs of stone from the inventory of the selected type of stone material.

13. The method of claim 11, further comprising generating in a graphical user interface a list of types of material for which there are slabs in inventory and receiving, in response, a user selection of one or more types of material.

14. A non-transitory computer readable media on which is stored instructions that, when read and executed by a computer cause the computer to perform a process for assisting a user with planning an installation comprised of two or more stone pieces cut from one or more slabs of stone, the method comprising:

generating an interactive graphical user interface on a display in communication with the computer, the graphical user interface comprising a drawing canvas for displaying a visual representation of an installation, the installation comprising one or more pieces of material cut from one or more slabs of the material, and the visual representation comprising a plurality of shapes, each shape representing a piece of material in the installation; wherein each of the plurality of shapes each has a relative position and size that corresponds to a relative position and size of the two or more pieces of material in the installation;

generating in the graphical user interface a layout superimposed on a photographic image of each of the one or more slabs of material, the layout comprising each of the plurality of shapes arranged to indicate where each of the pieces is to be cut from the slab of material;

for each of the plurality of shapes in the visual representation, applying to the shape a portion of the photographic image delineated by a corresponding shape in the layout; and in response to user input changing the relative position or size of one of the plurality shapes in either the visual representation of the installation or the layout automatically updating the position or size of the corresponding shape in the other of the drawing canvas and layout.

15. The non-transitory computer readable media of claim 14, wherein the process further comprises generating information for cutting each of the one or more slabs.

16. The non-transitory computer readable media of claim 14, wherein the process further comprises displaying to the user a visual representation of an inventory containing a plurality of slabs of material and photographic images for each of the plurality of slabs of material; wherein the one or more slabs of material comprise slabs of material picked by the user from the displayed inventory.

17. The non-transitory computer readable media of claim 16, wherein the process further comprises displaying to the user a graphical representation of a plurality of types of stone material and, in response to a user input selecting one of the plurality of types of stone material displaying bundles of slabs of stone from the inventory of the selected type of stone material.

18. The non-transitory computer readable media of claim 17, wherein the process further comprises, further comprising generating in the graphical user interface a list of types of material for which there are slabs in inventory and receiving, in response, a user selection of one or more types of material.

* * * * *